(12) United States Patent
Colburn et al.

(10) Patent No.: US 11,137,536 B2
(45) Date of Patent: Oct. 5, 2021

(54) BRAGG-LIKE GRATINGS ON HIGH REFRACTIVE INDEX MATERIAL

(71) Applicant: Facebook Technologies, LLC, Menlo Park, CA (US)

(72) Inventors: Matthew E. Colburn, Woodinville, WA (US); Nihar Ranjan Mohanty, Snoqualmie, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 244 days.

(21) Appl. No.: 16/046,407

(22) Filed: Jul. 26, 2018

(65) Prior Publication Data
US 2020/0033530 A1 Jan. 30, 2020

(51) Int. Cl.
*F21V 8/00* (2006.01)
*G02B 27/01* (2006.01)
(Continued)

(52) U.S. Cl.
CPC ......... *G02B 6/0065* (2013.01); *G02B 6/0016* (2013.01); *G02B 6/0036* (2013.01);
(Continued)

(58) Field of Classification Search
None
See application file for complete search history.

(56) References Cited

U.S. PATENT DOCUMENTS

| 4,595,484 A | 6/1986 | Giammarco et al. |
| 4,956,314 A * | 9/1990 | Tam .................. H01L 21/28587 257/E21.248 |

(Continued)

FOREIGN PATENT DOCUMENTS

| CN | 1859959 | 11/2006 |
| CN | 102645688 | 10/2014 |

(Continued)

OTHER PUBLICATIONS

International Application No. PCT/US2018/058272, "International Search Report and Written Opinion," dated Mar. 11, 2019, 14 pages.

(Continued)

*Primary Examiner* — Allan W. Olsen
(74) *Attorney, Agent, or Firm* — Weaver Austin Villeneuve & Sampson LLP

(57) ABSTRACT

Techniques for fabricating a slanted structure are disclosed. In one embodiment, a method for fabricating a slanted structure on a material layer includes forming a mask layer on the material layer, and implanting ions into a plurality of regions of the material layer at a slant angle greater than zero using an ion beam and the mask layer. The slant angle is measured with respect to a surface normal of the material layer. Implanting the ions into the plurality of regions of the material layer changes a refractive index or an etch rate of the plurality of regions of the material layer. In some embodiments, the method further includes wet-etching the material layer using an etchant to remove materials in the plurality of regions of the material layer. In some embodiments, the method includes either simultaneous or post-implantation etching of modified material through a dry etching process using reactive etchants in feed gas.

17 Claims, 15 Drawing Sheets

(51) Int. Cl.
*H01J 37/20* (2006.01)
*H01J 37/317* (2006.01)
*H01J 37/305* (2006.01)

(52) U.S. Cl.
CPC .......... *G02B 27/0172* (2013.01); *H01J 37/20* (2013.01); *H01J 37/3171* (2013.01); *G02B 2027/0178* (2013.01); *H01J 37/3056* (2013.01)

(56) References Cited

U.S. PATENT DOCUMENTS

| | | |
|---|---|---|
| 5,668,026 A | 9/1997 | Lin et al. |
| 5,712,188 A | 1/1998 | Chu et al. |
| 5,770,120 A | 6/1998 | Kamihara et al. |
| 5,973,361 A | 10/1999 | Hshieh et al. |
| 6,172,791 B1 | 1/2001 | Gill et al. |
| 6,238,582 B1 | 5/2001 | Williams et al. |
| 7,052,575 B1 | 5/2006 | Rangarajan et al. |
| 7,172,973 B1 | 2/2007 | Foote et al. |
| 7,357,138 B2 | 4/2008 | Ji et al. |
| 8,087,379 B2 | 1/2012 | Chandler et al. |
| 8,494,320 B2 | 7/2013 | Matsuda |
| 8,597,966 B2 | 12/2013 | Hiratsuka |
| 9,182,596 B2 | 11/2015 | Border et al. |
| 9,341,843 B2 | 5/2016 | Border et al. |
| 9,390,935 B2 | 7/2016 | Tomura et al. |
| 10,004,133 B2 | 6/2018 | Liang et al. |
| 10,073,278 B2 | 9/2018 | Vallius |
| 10,502,958 B2 | 12/2019 | Mohanty |
| 10,684,407 B2 | 6/2020 | Mohanty |
| 10,727,072 B2 | 7/2020 | Atikian et al. |
| 2003/0206698 A1 | 11/2003 | Goldstein |
| 2004/0011380 A1 | 1/2004 | Ji et al. |
| 2004/0014327 A1 | 1/2004 | Ji et al. |
| 2004/0047313 A1* | 3/2004 | Rumpf .............. H04B 10/25752 370/335 |
| 2004/0129671 A1 | 7/2004 | Ji et al. |
| 2005/0211547 A1 | 9/2005 | Hanawa et al. |
| 2006/0019477 A1 | 1/2006 | Hanawa et al. |
| 2006/0045987 A1 | 3/2006 | Chandler et al. |
| 2006/0127830 A1 | 6/2006 | Deng et al. |
| 2008/0029716 A1 | 2/2008 | Chen |
| 2009/0170331 A1 | 7/2009 | Cheng et al. |
| 2010/0322557 A1 | 12/2010 | Matsuda et al. |
| 2012/0177908 A1 | 7/2012 | Petorak et al. |
| 2012/0196139 A1 | 8/2012 | Petorak et al. |
| 2013/0183780 A1 | 7/2013 | Hiratsuka |
| 2013/0192758 A1 | 8/2013 | Toth et al. |
| 2014/0116621 A1 | 5/2014 | Mori et al. |
| 2014/0251790 A1 | 9/2014 | Kodaira et al. |
| 2015/0125976 A1 | 5/2015 | Wang |
| 2015/0279686 A1 | 10/2015 | Kuo et al. |
| 2015/0309316 A1 | 10/2015 | Osterhout et al. |
| 2016/0035539 A1 | 2/2016 | Sainiemi et al. |
| 2016/0042971 A1 | 2/2016 | Mohanty |
| 2016/0187654 A1 | 6/2016 | Border et al. |
| 2017/0031171 A1 | 2/2017 | Vallius et al. |
| 2017/0059879 A1 | 3/2017 | Vallius |
| 2017/0301519 A1 | 10/2017 | Naim et al. |
| 2017/0307887 A1 | 10/2017 | Stenberg et al. |
| 2017/0311430 A1 | 10/2017 | Liang et al. |
| 2017/0352522 A1* | 12/2017 | Landis ................ H01J 37/3175 |
| 2018/0138047 A1 | 5/2018 | Atikian et al. |
| 2019/0129089 A1 | 5/2019 | Monhanty |
| 2019/0129180 A1 | 5/2019 | Monhanty |
| 2019/0212480 A1* | 7/2019 | Evans .................. G02B 5/1814 |
| 2020/0264362 A1 | 8/2020 | Monhanty |

FOREIGN PATENT DOCUMENTS

| | | |
|---|---|---|
| CN | 111448485 | 7/2020 |
| CN | 111492315 A | 8/2020 |
| CN | 112313547 A | 2/2021 |
| EP | 1228401 | 8/2005 |
| EP | 1855131 A1 | 11/2007 |
| EP | 1183684 | 6/2008 |
| EP | 3477347 | 1/2019 |
| EP | 3714297 | 9/2020 |
| JP | 2021503709 | 7/2020 |
| KR | 20200066733 | 6/2020 |
| TW | 201931954 | 8/2019 |
| WO | 2019089086 A1 | 5/2019 |
| WO | 2019089639 | 5/2019 |
| WO | WO 2020023055 | 1/2020 |

OTHER PUBLICATIONS

International Application No. PCT/US2018/036515, International Search Report and Written Opinion dated Sep. 27, 2018, 15 pages.
Miller et al., "Design and Fabrication of Binary Slanted Surface-Relief Gratings for a Planar Optical Interconnection," Applied Optics, vol. 36, No. 23, Aug. 10, 1997, 12 pages.
International Application No. PCT/US2018/044068, "International Search Report and Written Opinion", dated Apr. 26, 2019, 14 pages.
U.S. Restriction Requirement dated May 8, 2019 in U.S. Appl. No. 16/001,694.
U.S. Non-Final Office Action dated Aug. 20, 2019 in U.S. Appl. No. 16/001,694.
Notice of Allowance dated Feb. 7, 2020 in U.S. Appl. No. 16/001,694.
U.S. Office Action dated Apr. 1, 2019 in U.S. Appl. No. 16/174,305.
Notice of Allowance dated Aug. 1, 2019 in U.S. Appl. No. 16/174,305.
Notice of Allowance dated Oct. 30, 2019 in U.S. Appl. No. 16/174,305.
European Application No. EP18202897.7, "Extended European Search Report", dated Mar. 19, 2019, 10 pages.
Lee, et al., "Dry Etching of GaN Using Reactive Ion Beam Etching and Chemically Assisted Reactive Ion Beam Etching", MRS Proceedings, vol. 468, Jan. 1, 1997, 5 pages.
Oxford Instruments, "Ionfab 300, Flexible Tools for Multiple Applications", 2015, retrieved from "https://plasma.oxinst.com/assets/uploads/Ionfab300_ 4.pdf" and printed on Mar. 19, 2019, 5 pages.
Rowe, et al., "High-Reflectivity Surface-Relief Gratings in Single-Mode Optical Fibers", IEE Proceedings-J/Optoelectronics, vol. 134, Issue 3, Jun. 1, 1987, 6 pages.
U.S. Non-Final Office Action dated May 14, 2021 in U.S. Appl. No. 16/868,204.
Notice of Allowance dated May 26, 2021 in U.S. Appl. No. 16/867,902.
Chinese Application No. 201880079718.0 "Office Action", dated Apr. 26, 2021, 7 pages.

* cited by examiner

BRAGG-LIKE GRATINGS ON HIGH REFRACTIVE INDEX MATERIAL

BACKGROUND

An artificial reality system, such as a head-mounted display (HMD) or heads-up display (HUD) system, generally includes a display configured to present artificial images that depict objects in a virtual environment. The display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted grating (e.g., a surface-relief or Bragg-like grating). In many cases, it may be challenging to fabricate the slanted grating with the desired profile at a desirable yield and productivity.

SUMMARY

This disclosure relates generally to techniques for fabricating slanted structures, and more specifically, to techniques for making slanted structures (e.g., slanted gratings) on various materials, such as silicon nitride, organic materials, or inorganic metal oxides, etc. For some materials, a slanted ion implementation technique may be used to modify the refractive index of a material layer (e.g., a substrate) to form a slanted grating, or to modify the etch rate of the material layer such that the material layer may be selectively etched to remove the ion-implanted regions to form a slanted structure. For some materials, a concurrent or sequential ion bombardment-based material modification technique may be used in conjunction with a reactive gas to simultaneously modify and remove the material, thereby forming slanted gratings as defined by a hard mask. The slanted structures obtained by the processes and techniques disclosed herein can have a large slant angle, a high depth, and similar slant angles for the leading edge and trailing edge of a ridge.

In some embodiments, the slant angle of the slanted structure (e.g., a slanted grating) can be changed by changing the incident angle of ions with respect to the substrate during the ion implantation. The energy of the ions can be modified to change a depth of the slanted grating. Further, the composition of the ions can be modified through appropriate selection of feed gas mixture, ion source, and extraction parameters. The refractive index of the implanted region can be modified by modifying the concentration of the implanted ions. In some embodiments, the slant angle, ion energy, and/or ion concentration can be varied over different regions of the slanted grating. In some embodiments, similar techniques may be applied to an overcoat layer for the slanted grating.

In some embodiments, a method of fabricating a slanted structure on a material layer may include forming a mask layer on the material layer, and implanting ions into a plurality of regions of the material layer at a slant angle greater than zero using an ion beam and the mask layer, where the slant angle is measured with respect to a surface normal of the material layer. Implanting the ions into the plurality of regions of the material layer may change a refractive index or an etch rate of the plurality of regions of the material layer. In some embodiments, the material layer may include one or more of a transparent substrate, a semiconductor substrate, a SiO2 layer, a Si3N4 material layer, a titanium oxide layer, an alumina layer, a SiC layer, a SiOxNy layer, an amorphous silicon layer, a spin on carbon (SOC) layer, an amorphous carbon layer (ACL), a diamond like carbon (DLC) layer, a TiOx layer, an AlOx layer, a TaOx layer, and an HFOx layer. In some embodiments, the ions may include hydrogen ions or oxygen ions.

In some embodiments, the method of fabricating the slanted structure may include wet-etching the material layer using an etchant to remove materials in the plurality of regions of the material layer. In some embodiments, the material layer may include a $Si_3N_4$ material layer, the ions may include hydrogen ions, and the etchant may include a diluted hydrofluoric acid. In some embodiments, the method may further include performing the implanting and wet-etching repeatedly until a predetermined depth of the slanted structure is reached. In some embodiments, the predetermined depth of the slanted structure is greater than 100 nm.

In some embodiments, implanting ions into the plurality of regions of the material layer at a slant angle greater than zero may include at least one of rotating the material layer during the implanting to vary the slant angle for the plurality of regions, or changing an ion energy of the ions during the implanting to change an implantation depth for the plurality of regions. In some embodiments, the method may further include wet-etching the material layer using an etchant to remove materials in the plurality of regions of the material layer, removing the mask layer, and forming an overcoat layer on the material layer. In some embodiments, the method may further include performing ion implantation on the overcoat layer to change refractive indexes in some regions of the overcoat layer. The overcoat layer may include, for example, one or more of fluorinated $SiO_2$, porous silicate, $SiO_xN_y$, $HFO_2$, and $Al_2O_3$.

In some embodiments, implanting ions into the plurality of regions of the material layer may include implanting different amounts of ions into different regions of the plurality of regions by using different ion currents for the ion beam, different implantation times, or both when implanting different regions of the plurality of regions. In some embodiments, the material layer may include a $Si_3N_4$ material layer, and the ions may include oxygen ions. In some embodiments, the slant angle may be greater than 45°.

In some embodiments, an ion implantation system for fabricating a slanted optical device on a substrate may include an ion source for generating ions of a chemical element, an accelerator for electrostatically accelerating the ions, and a target chamber including a supporting structure, where the supporting structure may be configured to hold the substrate and is rotatable with respect to a moving direction of the ions. In some embodiments, ion implantation system may also include a controller configured to change a rotation angle of the supporting structure such that the ions impinge on the substrate at a predetermined slant angle.

In some embodiments of the ion implantation system, the controller may be configured to control at least one of a speed of the ions, a flux of the ions, an implantation time, a rotation speed of the supporting structure, or a linear moving speed of the supporting structure. In some embodiments, the controller may further be configured to rotate the supporting structure to different rotation angles for implanting different regions of the substrate, accelerate the ions to different speeds for implanting different regions of the substrate, or implanting different numbers of ions into different regions of the substrate. In some embodiments, the chemical element may include hydrogen or oxygen, and the substrate may include a $Si_3N_4$ layer.

In some embodiments, a slanted surface-relief grating may be obtained by a process, where the process may include forming a mask layer on a material layer, implanting ions into a plurality of regions of the material layer at a slant angle greater than 30° (measured with respect to a surface normal of the material layer) using an ion beam and the mask layer, and wet-etching the material layer using an etchant to remove materials in the plurality of regions of the material layer. In some embodiments, the material layer may include a $Si_3N_4$ material layer, the ions may include hydrogen ions, and the etchant may include a diluted hydrofluoric acid. In some embodiments, the process may further include performing the implanting and wet-etching repeatedly until a predetermined depth of the slanted surface-relief grating is reached, where the predetermined depth may be greater than 100 nm.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
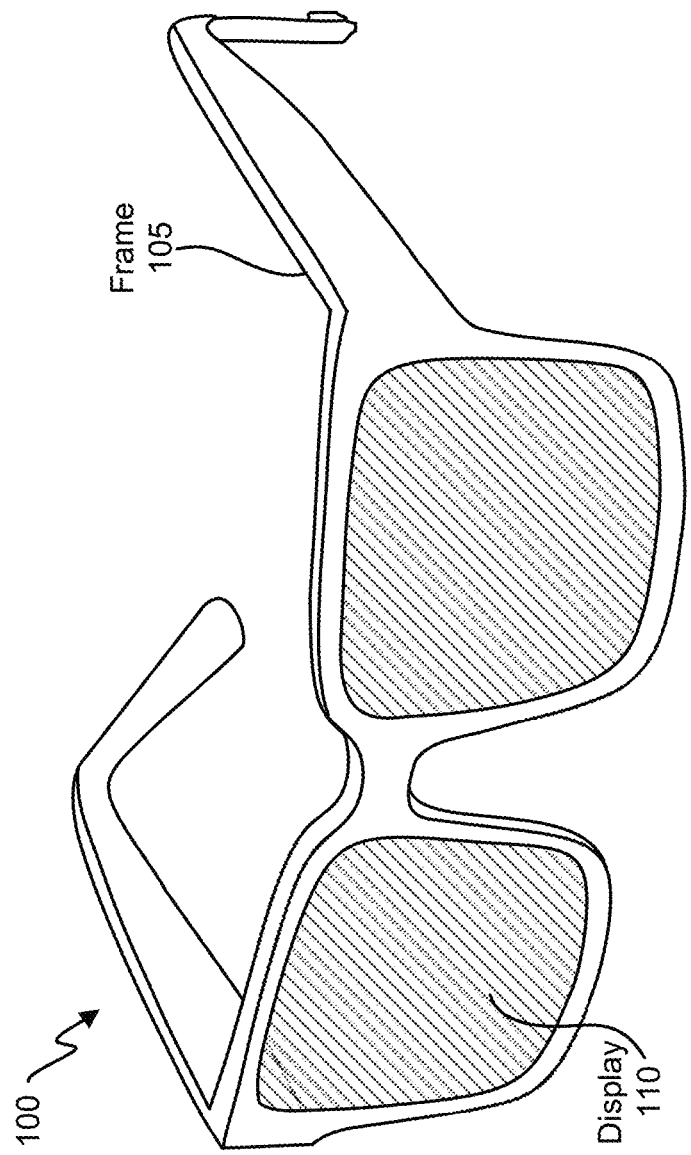
FIG. 1 is a simplified diagram of an example near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Techniques disclosed herein relate generally to micro- or nano-structure manufacturing. More specifically, and without limitation, this application relates to techniques for fabricating micro or nano slanted structures. In some embodiments, it is found that it is desirable to fabricate slanted structures for manipulating behaviors of light. Some of the benefits of the slanted structures may include a high efficiency of light transfer, a large variation in refractive indices, and/or the like. It is also found that the parallel slanted (with respect to the plane of the surface being etched) structures with constant or variable slant parameters solve a problem unique to certain applications. Furthermore, it has been found that it may be desirable to form this type of slanted structures in different types of materials (e.g., silicon nitride, organic materials, or inorganic metal oxides, etc.). However, it may often be challenging to etch high symmetrical slanted structures (e.g., a ridge with substantially equal leading edge and trailing edge), deep slanted structures, or slanted structures with large slant angles in these materials.

According to certain embodiments, slanted gratings may be used in some optical devices, such as waveguide displays in artificial reality systems, to create high refractive index variations and high diffraction efficiencies. The slanted structures, such as deep or parallel slanted structures, may not be reliably fabricated on certain materials using current known etching processes, which may generally be optimized to etch features that are perpendicular to the surface being etched, such as the ion beam etching (IBE), reactive ion beam etching (RIBE), or chemically assisted ion beam etching (CAIBE) process. According to certain embodiments, an ion implementation technique and a wet etching technique may be used in combination to reliably etch the slanted structures. The ion implantation process parameters, including, for example, the ions, the ion flux, the ion energy, the implantation angle, and the implantations time, can be more precisely controlled to achieve the desired etching selectivity, desired etch rate, and desired dimensions of the slanted structures. In some embodiments, the ion implantation technique may also be used independently to make slanted Bragg-like gratings by modifying the refractive index of the implanted regions. In some embodiments, concurrent or sequential ion bombardment-based material modification strategy can be used in conjunction with a reactive gas through appropriate choice of feed gas mixture, ion source, and extraction parameters, to make slanted Bragg-like gratings as defined by a hard mask.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

FIG. 1 is a simplified diagram of an example near-eye display 100 according to certain embodiments. Near-eye display 100 may present media to a user. Examples of media presented by near-eye display 100 may include one or more images, video, and/or audio. In some embodiments, audio may be presented via an external device (e.g., speakers and/or headphones) that receives audio information from near-eye display 100, a console, or both, and presents audio data based on the audio information. Near-eye display 100 is generally configured to operate as an artificial reality display. In some embodiments, near-eye display 100 may operate as an augmented reality (AR) display or a mixed reality (MR) display.

Near-eye display 100 may include a frame 105 and a display 110. Frame 105 may be coupled to one or more optical elements. Display 110 may be configured for the user to see content presented by near-eye display 100. In some embodiments, display 110 may include a waveguide display assembly for directing light from one or more images to an eye of the user.

Figure 2:
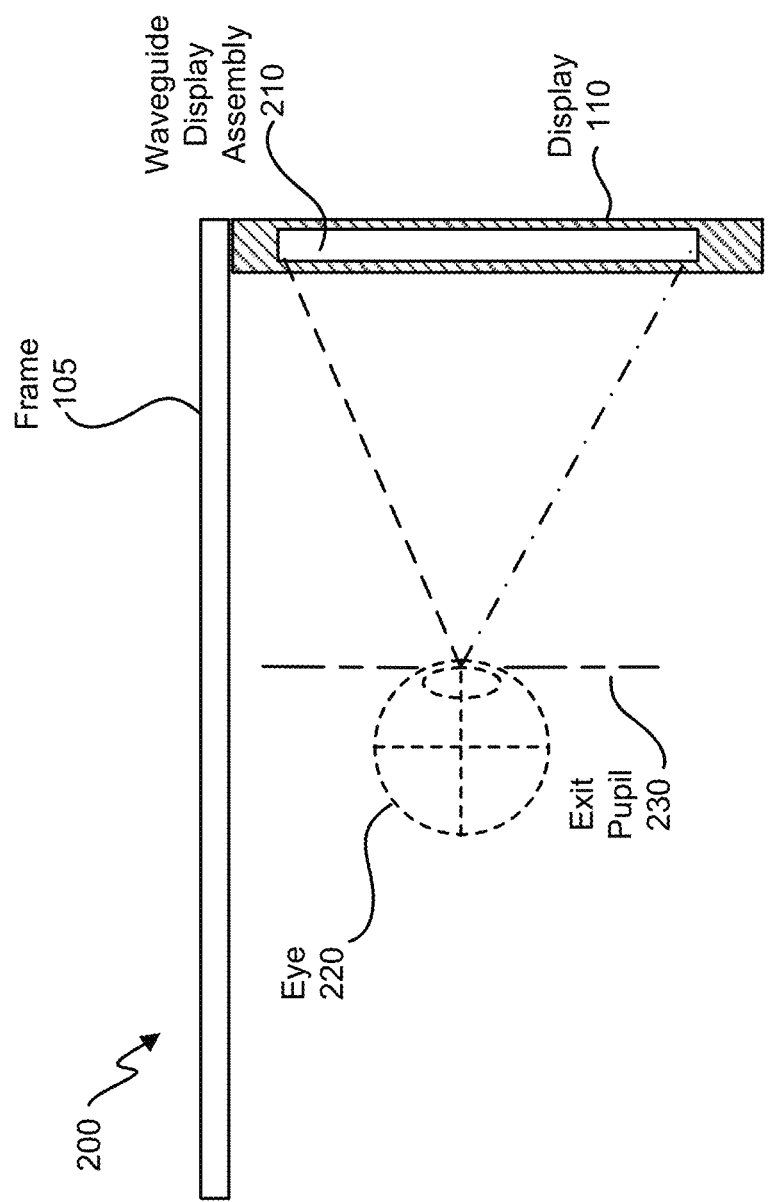
FIG. 2 is a cross-sectional view of an example near-eye display according to certain embodiments.

FIG. 2 is a cross-sectional view 200 of near-eye display 100 illustrated in FIG. 1. Display 110 may include may include at least one waveguide display assembly 210. An exit pupil 230 may be located at a location where a user's eye 220 is positioned when the user wears near-eye display 100. For purposes of illustration, FIG. 2 shows cross-section sectional view 200 associated with user's eye 220 and a single waveguide display assembly 210, but, in some embodiments, a second waveguide display may be used for the second eye of the user.

Waveguide display assembly 210 may be configured to direct image light (i.e., display light) to an eyebox located at exit pupil 230 and to user's eye 220. Waveguide display assembly 210 may include one or more materials (e.g., plastic, glass, etc.) with one or more refractive indices. In some embodiments, near-eye display 100 may include one or more optical elements between waveguide display assembly 210 and user's eye 220.

In some embodiments, waveguide display assembly 210 may include a stack of one or more waveguide displays including, but not restricted to, a stacked waveguide display, a varifocal waveguide display, a multi-focal (or multi-planar) display, etc. The stacked waveguide display is a polychromatic display (e.g., a red-green-blue (RGB) display) created by stacking waveguide displays whose respective monochromatic sources are of different colors. The stacked waveguide display may also be a polychromatic display that can be projected on multiple planes (e.g. multi-planar colored display). In some configurations, the stacked waveguide display may be a monochromatic display that can be projected on multiple planes (e.g. multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
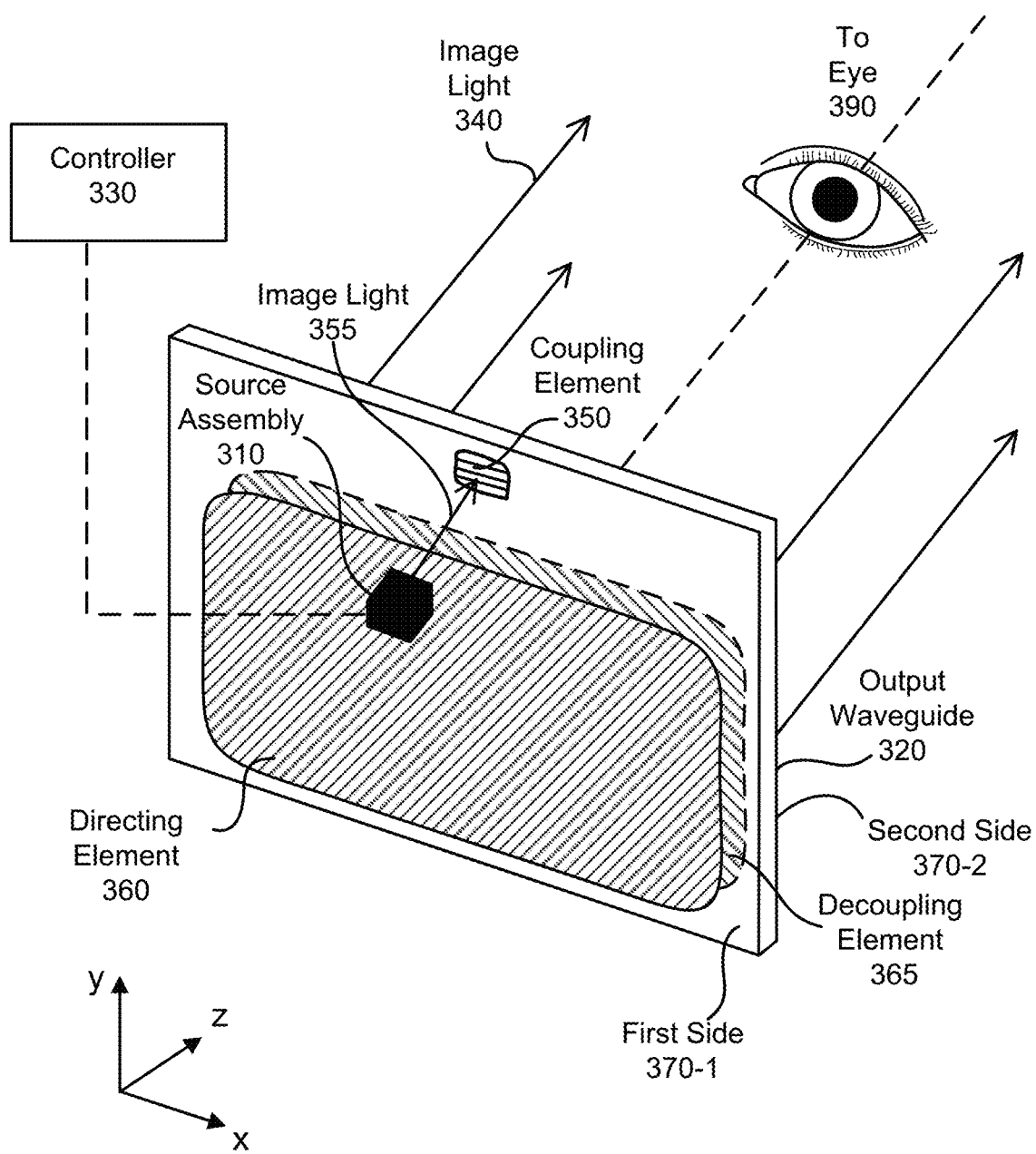
FIG. 3 is an isometric view of an example waveguide display according to certain embodiments.

FIG. 3 is an isometric view of an embodiment of a waveguide display 300. In some embodiments, waveguide display 300 may be a component (e.g., waveguide display assembly 210) of near-eye display 100. In some embodiments, waveguide display 300 may be part of some other near-eye displays or other systems that may direct image light to a particular location.

Waveguide display 300 may include a source assembly 310, an output waveguide 320, and a controller 330. For purposes of illustration, FIG. 3 shows waveguide display 300 associated with a user's eye 390, but in some embodiments, another waveguide display separate, or partially separate, from waveguide display 300 may provide image light to another eye of the user.

Source assembly 310 may generate image light 355 for display to the user. Source assembly 310 may generate and output image light 355 to a coupling element 350 located on a first side 370-1 of output waveguide 320. In some embodiments, coupling element 350 may couple image light 355 from source assembly 310 into output waveguide 320. Coupling element 350 may include, for example, a diffraction grating, a holographic grating, one or more cascaded reflectors, one or more prismatic surface elements, and/or an array of holographic reflectors. Output waveguide 320 may be an optical waveguide that can output expanded image light 340 to user's eye 390. Output waveguide 320 may receive image light 355 at one or more coupling elements 350 located on first side 370-1 and guide received image light 355 to a directing element 360.

Directing element 360 may redirect received input image light 355 to decoupling element 365 such that received input image light 355 may be coupled out of output waveguide 320 via decoupling element 365. Directing element 360 may be part of, or affixed to, first side 370-1 of output waveguide 320. Decoupling element 365 may be part of, or affixed to, a second side 370-2 of output waveguide 320, such that directing element 360 is opposed to decoupling element 365. Directing element 360 and/or decoupling element 365 may include, for example, a diffraction grating, a holographic grating, a surface-relief grating, one or more cascaded reflectors, one or more prismatic surface elements, and/or an array of holographic reflectors.

Second side 370-2 of output waveguide 320 may represent a plane along an x-dimension and a y-dimension. Output waveguide 320 may include one or more materials that can facilitate total internal reflection of image light 355. Output waveguide 320 may include, for example, silicon, plastic, glass, and/or polymers. Output waveguide 320 may have a relatively small form factor. For example, output waveguide 320 may be approximately 50 mm wide along the x-dimension, about 30 mm long along the y-dimension, and about 0.5 to 1 mm thick along a z-dimension.

Controller 330 may control scanning operations of source assembly 310. Controller 330 may determine scanning instructions for source assembly 310. In some embodiments, output waveguide 320 may output expanded image light 340 to user's eye 390 with a large field of view (FOV). For example, expanded image light 340 provided to user's eye 390 may have a diagonal FOV (in x and y) of about 60 degrees or greater and/or about 150 degrees or less. Output waveguide 320 may be configured to provide an eyebox with a length of about 20 mm or greater and/or equal to or less than about 50 mm, and/or a width of about 10 mm or greater and/or equal to or less than about 50 mm.

Figure 4:
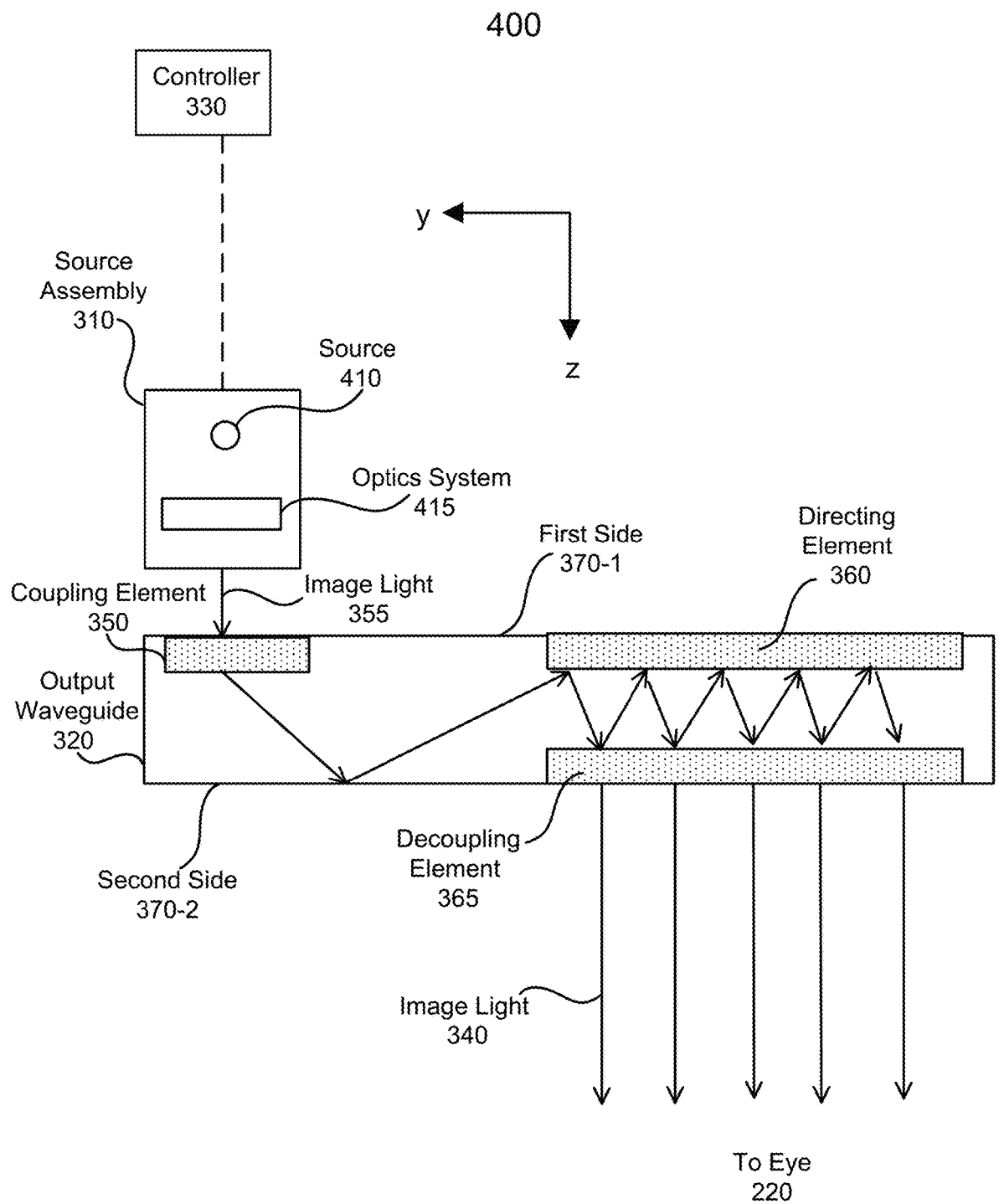
FIG. 4 is a cross-sectional view of an example waveguide display according to certain embodiments.

FIG. 4 is a cross-sectional view 400 of waveguide display 300. Waveguide display 300 may be mono or poly chromatic. Waveguide display 300 may include source assembly 310 and output waveguide 320. Source assembly 310 may generate image light 355 (i.e., display light) in accordance with scanning instructions from controller 330. Source assembly 310 may include a source 410 and an optics system 415. Source 410 may include a light source that generates coherent or partially coherent light. For example, source 410 may include a laser diode, a vertical cavity surface emitting laser, a light emitting diode, or a 1-D or 2-D array of lasers diodes, VCSELs, or LEDs (e.g., a μLED array).

Optics system 415 may include one or more optical components that can condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. Light emitted from optics system 415 (and also source assembly 310) may be referred to as image light 355 or display light.

Output waveguide 320 may receive image light 355 from source assembly 310. Coupling element 350 may couple image light 355 from source assembly 310 into output waveguide 320. In embodiments where coupling element 350 includes a diffraction grating, the diffraction grating may be configured such that total internal reflection may occur within output waveguide 320, and thus image light 355 coupled into output waveguide 320 may propagate internally within output waveguide 320 (e.g., by total internal reflection) toward decoupling element 365.

Directing element 360 may redirect image light 355 toward decoupling element 365 for coupling at least a portion of the image light out of output waveguide 320. In embodiments where directing element 360 is a diffraction grating, the diffraction grating may be configured to cause incident image light 355 to exit output waveguide 320 at angle(s) of inclination relative to a surface of decoupling element 365. In some embodiments, directing element 360 and/or the decoupling element 365 may be structurally similar.

Expanded image light 340 exiting output waveguide 320 may be expanded along one or more dimensions (e.g., elongated along the x-dimension). In some embodiments, waveguide display 300 may include a plurality of source assemblies 310 and a plurality of output waveguides 320. Each of source assemblies 310 may emit a monochromatic image light corresponding to a primary color (e.g., red, green, or blue). Each of output waveguides 320 may be stacked together to output an expanded image light 340 that may be multi-colored.

Figure 5:
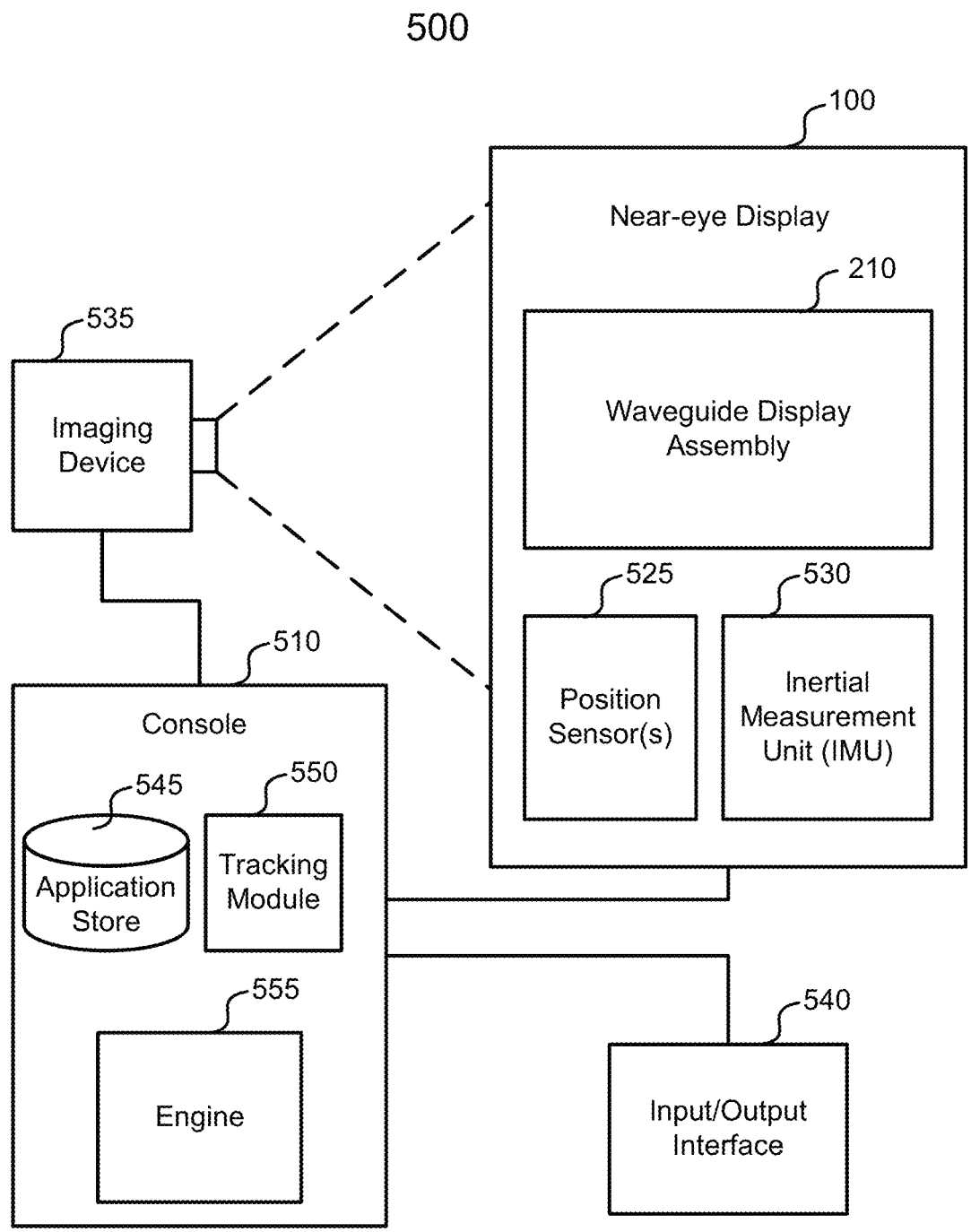
FIG. 5 is a simplified block diagram of an example artificial reality system including a waveguide display.

FIG. 5 is a simplified block diagram of an example artificial reality system 500 including waveguide display assembly 210. System 500 may include near-eye display 100, an imaging device 535, and an input/output interface 540 that are each coupled to a console 510.

As described above, near-eye display 100 may be a display that presents media to a user. Examples of media presented by near-eye display 100 may include one or more images, video, and/or audio. In some embodiments, audio may be presented via an external device (e.g., speakers and/or headphones) that may receive audio information from near-eye display 100 and/or console 510 and present audio data based on the audio information to a user. In some embodiments, near-eye display 100 may act as an artificial reality eyewear glass. For example, in some embodiments, near-eye display 100 may augment views of a physical, real-world environment, with computer-generated elements (e.g., images, video, sound, etc.).

Near-eye display 100 may include waveguide display assembly 210, one or more position sensors 525, and/or an inertial measurement unit (IMU) 530. Waveguide display assembly 210 may include a waveguide display, such as waveguide display 300 that includes source assembly 310, output waveguide 320, and controller 330 as described above.

IMU 530 may include an electronic device that can generate fast calibration data indicating an estimated position of near-eye display 100 relative to an initial position of near-eye display 100 based on measurement signals received from one or more position sensors 525.

Imaging device 535 may generate slow calibration data in accordance with calibration parameters received from console 510. Imaging device 535 may include one or more cameras and/or one or more video cameras.

Input/output interface 540 may be a device that allows a user to send action requests to console 510. An action request may be a request to perform a particular action. For example, an action request may be to start or end an application or to perform a particular action within the application.

Console 510 may provide media to near-eye display 100 for presentation to the user in accordance with information received from one or more of: imaging device 535, near-eye display 100, and input/output interface 540. In the example shown in FIG. 5, console 510 may include an application store 545, a tracking module 550, and an engine 555.

Application store 545 may store one or more applications for execution by the console 510. An application may include a group of instructions that, when executed by a processor, may generate content for presentation to the user. Examples of applications may include gaming applications, conferencing applications, video playback application, or other suitable applications.

Tracking module 550 may calibrate system 500 using one or more calibration parameters and may adjust one or more calibration parameters to reduce error in determination of the position of near-eye display 100. Tracking module 550 may track movements of near-eye display 100 using slow calibration information from imaging device 535. Tracking module 550 may also determine positions of a reference point of near-eye display 100 using position information from the fast calibration information.

Engine 555 may execute applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210. The signal may determine a type of content to present to the user.

There may be many different ways to implement the waveguide display. For example, in some implementations, output waveguide 320 may include a slanted surface between first side 370-1 and second side 370-2 for coupling image light 355 into output waveguide 320. In some implementations, the slanted surface may be coated with a reflective coating to reflect light towards directing element 360. In some implementations, the angle of the slanted surface may be configured such that image light 355 may be reflected by the slanted surface due to total internal reflection. In some implementations, directing element 360 may not be used, and light may be guided within output waveguide 320 by total internal reflection. In some implementations, decoupling elements 365 may be located near first side 370-1.

In some implementations, output waveguide 320 and decoupling element 365 (and directing element 360 if used) may be transparent to light from the environment, and may act as an optical combiner for combining image light 355 and light from the physical, real-world environment in front of near-eye display 100. As such, the user can view both artificial images of artificial objects from source assembly 310 and real images of real objects in the physical, real-world environment, which may be referred to as optical see-through.

Figure 6:
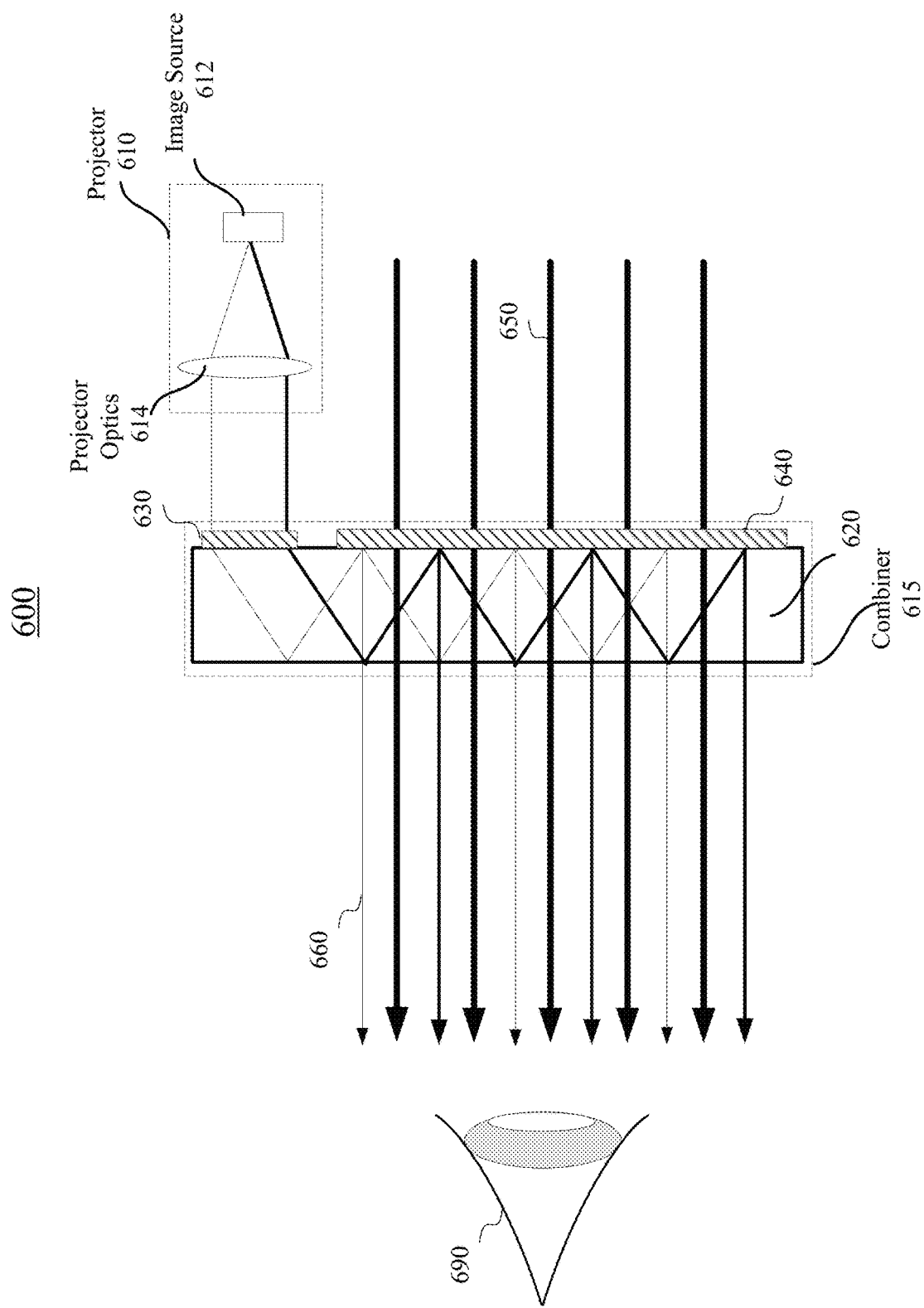
FIG. 6 illustrates an example optical see-through augmented reality system using a waveguide display according to certain embodiments.

FIG. 6 illustrates an example optical see-through augmented reality system 600 using a waveguide display according to certain embodiments. Augmented reality system 600 may include a projector 610 and a combiner 615. Projector 610 may include a light source or image source 612 and projector optics 614. In some embodiments, image source 612 may include a plurality of pixels that displays virtual objects, such as an LCD display panel or an LED display panel. In some embodiments, image source 612 may include a light source that generates coherent or partially coherent light. For example, image source 612 may include a laser diode, a vertical cavity surface emitting laser, and/or a light emitting diode. In some embodiments, image source 612 may include a plurality of light sources each emitting a monochromatic image light corresponding to a primary color (e.g., red, green, or blue). In some embodiments, image source 612 may include an optical pattern generator, such as a spatial light modulator. Projector optics 614 may include one or more optical components that can condition the light from image source 612, such as expanding, collimating, scanning, or projecting light from image source 612 to combiner 615. The one or more optical components may include, for example, one or more lenses, liquid lenses, mirrors, apertures, and/or gratings. In some embodiments, projector optics 614 may include a liquid lens (e.g., a liquid crystal lens) with a plurality of electrodes that allows scanning of the light from image source 612.

Combiner 615 may include an input coupler 630 for coupling light from projector 610 into a substrate 620 of combiner 615. Input coupler 630 may include a volume holographic grating, a diffractive optical elements (DOE) (e.g., a surface-relief grating), or a refractive coupler (e.g., a wedge or a prism). Input coupler 630 may have a coupling efficiency of greater than 30%, 50%, 75%, 90%, or higher for visible light. As used herein, visible light may refer to light with a wavelength between about 380 nm to about 750 nm. Light coupled into substrate 620 may propagate within substrate 620 through, for example, total internal reflection (TIR). Substrate 620 may be in the form of a lens of a pair of eyeglasses. Substrate 620 may have a flat or a curved surface, and may include one or more types of dielectric materials, such as glass, quartz, plastic, polymer, poly(methyl methacrylate) (PMMA), crystal, or ceramic. In some embodiments, substrate 620 may include a semiconductor wafer, a $SiO_2$ layer, a $Si_3N_4$ material layer, a titanium oxide layer, an alumina layer, a SiC layer, a SiOxNy layer, an amorphous silicon layer, a spin on carbon (SOC) layer, an amorphous carbon layer (ACL), a diamond like carbon (DLC) layer, a TiOx layer, an AlOx layer, a TaOx layer, a HFOx layer, etc. A thickness of the substrate may range from, for example, less than about 1 mm to about 10 mm or more. Substrate 620 may be transparent to visible light. A material may be "transparent" to a light beam if the light beam can pass through the material with a high transmission rate, such as larger than 50%, 60%, 75%, 80%, 90%, 95%, or higher, where a small portion of the light beam (e.g., less than 50%, 40%, 25%, 20%, 10%, 5%, or less) may be scattered, reflected, or absorbed by the material. For example, in some embodiments, the transparent substrate may have a transmittance of 80% or higher. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 620 may include or may be coupled to a plurality of output couplers 640 configured to extract at least a portion of the light guided by and propagating within substrate 620 from substrate 620, and direct extracted light 660 to an eye 690 of the user of augmented reality system 600. As input coupler 630, output couplers 640 may include grating couplers (e.g., volume holographic gratings or surface-relief gratings), other DOEs, prisms, etc. Output couplers 640 may have different coupling (e.g., diffraction) efficiencies at different locations. Substrate 620 may also allow light 650 from environment in front of combiner 615 to pass through with little or no loss. Output couplers 640 may also allow light 650 to pass through with little loss. For example, in some implementations, output couplers 640 may have a low diffraction efficiency for light 650 such that light 650 may be refracted or otherwise pass through output couplers 640 with little loss. In some implementations, output couplers 640 may have a high diffraction efficiency for light 650 and may diffract light 650 to certain desired directions (i.e., diffraction angles) with little loss. As a result, the user may be able to view combined images of the environment in front of combiner 615 and virtual objects projected by projector 610.

Figure 7:
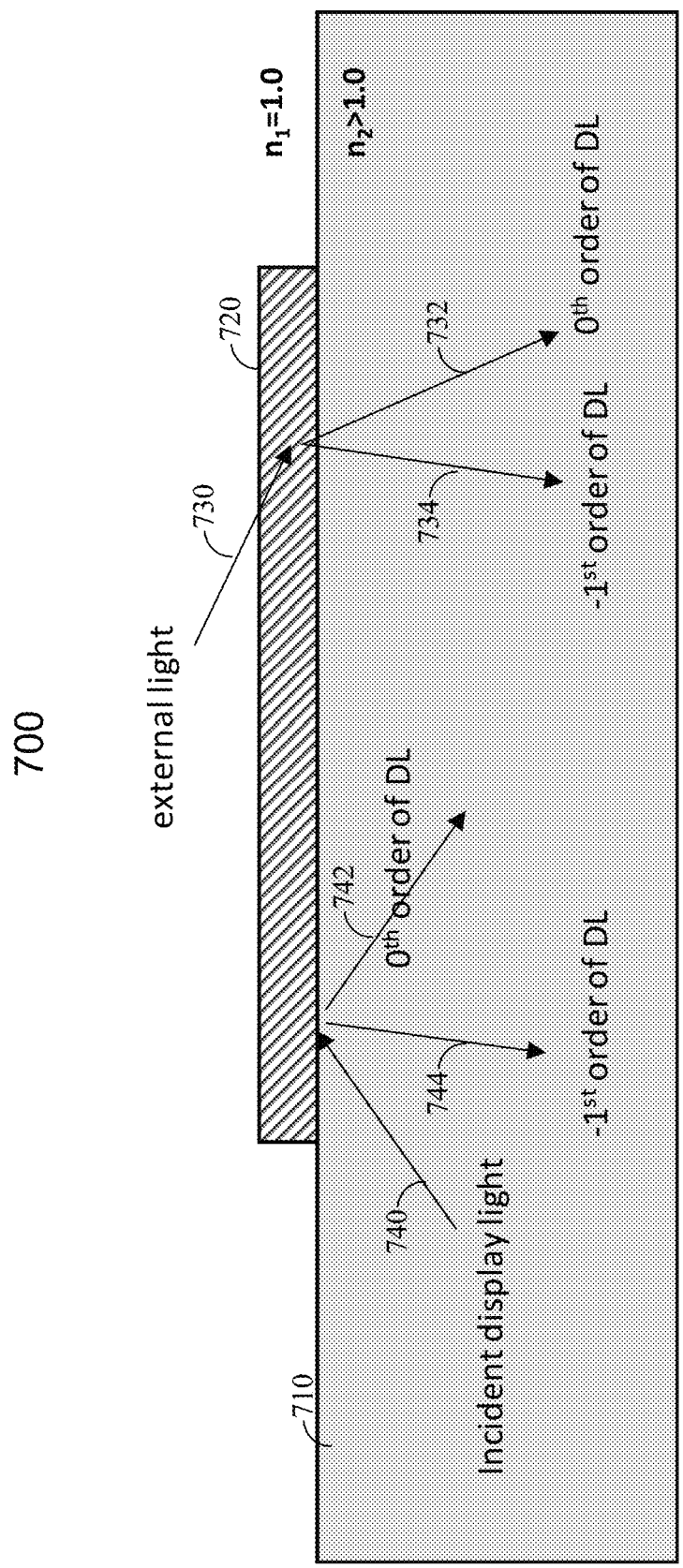
FIG. 7 illustrates propagations of display light and external light in an example waveguide display.

FIG. 7 illustrates propagations of incident display light 740 and external light 730 in an example waveguide display 700 including a waveguide 710 and a grating coupler 720. Waveguide 710 may be a flat or curved transparent substrate with a refractive index $n_2$ greater than the free space refractive index $n_1$ (i.e., 1.0). Grating coupler 720 may include, for example, a Bragg grating or a surface-relief grating.

Incident display light 740 may be coupled into waveguide 710 by, for example, input coupler 630 of FIG. 6 or other couplers (e.g., a prism or slanted surface) described above. Incident display light 740 may propagate within waveguide 710 through, for example, total internal reflection. When incident display light 740 reaches grating coupler 720, incident display light 740 may be diffracted by grating coupler 720 into, for example, a $0^{th}$ order diffraction (i.e., reflection) light 742 and a −1st order diffraction light 744. The $0^{th}$ order diffraction may continue to propagate within waveguide 710, and may be reflected by the bottom surface of waveguide 710 towards grating coupler 720 at a different location. The −1st order diffraction light 744 may be coupled (e.g., refracted) out of waveguide 710 towards the user's eye, because a total internal reflection condition may not be met at the bottom surface of waveguide 710 due to the diffraction angle of the $-1^{st}$ order diffraction light 744.

External light 730 may also be diffracted by grating coupler 720 into, for example, a $0^{th}$ order diffraction light 732 or a −1st order diffraction light 734. The $0^{th}$ order diffraction light 732 and/or the −1st order diffraction light 734 may be refracted out of waveguide 710 towards the user's eye. Thus, grating coupler 720 may act as an input coupler for coupling external light 730 into waveguide 710, and may also act as an output coupler for coupling incident display light 740 out of waveguide 710. As such, grating coupler 720 may act as a combiner for combining external light 730 and incident display light 740 and send the combined light to the user's eye.

In order to diffract light at a desired direction towards the user's eye and to achieve a desired diffraction efficiency for certain diffraction orders, grating coupler 720 may include a blazed or slanted grating, such as a slanted Bragg grating or surface-relief grating, where the grating ridges and grooves may be tilted relative to the surface normal of grating coupler 720 or waveguide 710. In some embodiments, to optimize the user experience, some parameters of grating coupler 720 may vary along the direction of light propagation within waveguide 710 such that the diffraction efficiency of grating coupler 720 may vary (e.g., increase) along the same direction to achieve a substantially uniform intensity across the display.

Figure 8:
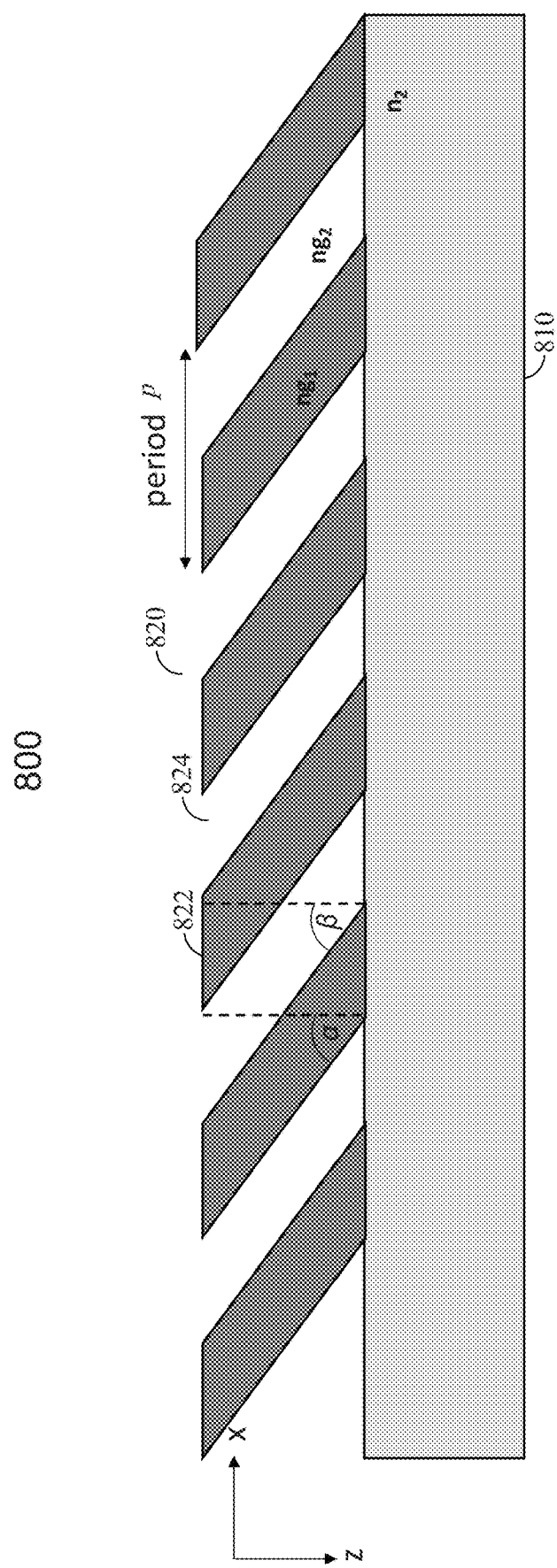
FIG. 8 illustrates an example slanted grating coupler in an example waveguide display according to certain embodiments.

FIG. 8 illustrates an example slanted grating 820 in an example waveguide display 800 according to certain embodiments. Waveguide display 800 may include slanted grating 820 on a waveguide 810, such as substrate 620. Slanted grating 820 may act as a grating coupler for couple light into or out of waveguide 810. In some embodiments, slanted grating 820 may include a periodic structure with a period p. For example, slanted grating 820 may include a plurality of ridges 822 and grooves 824 between ridges 822. Each period of slanted grating 820 may include a ridge 822 and a groove 824, which may be an air gap or a region filled with a material with a refractive index $n_{g2}$. The ratio between the width of a ridge 822 and the grating period p may be referred to as duty cycle. Slanted grating 820 may have a duty cycle ranging, for example, from about 10% to about 90% or greater. In some embodiments, the duty cycle may vary from period to period for more accurate image formation at user's eye. In some embodiments, the period p of the slanted grating may vary from one area to another on slanted grating 820, or may vary from one period to another (i.e., chirped) on slanted grating 820.

Ridges 822 may be made of a material with a refractive index of $n_{g1}$, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Each ridge 822 may include a leading edge 830 with a slant angel α and a trailing edge 840 with a slant angle β. In some embodiments, leading edge 830 and training edge 840 of each ridge 822 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70° or larger.

In some implementations, grooves 824 between the ridges 822 may be over-coated or filled with a material having a refractive index $n_{g2}$ higher or lower than the refractive index of the material of ridges 822. For example, in some embodiments, a high refractive index material, such as Hafnia, Titania, Tungsten oxide, Zirconium oxide, Gallium sulfide, Gallium nitride, Gallium phosphide, silicon, and a high refractive index polymer, may be used to fill grooves 824. In some embodiments, a low refractive index material, such as silicon oxide, magnesium fluoride, porous silica, or fluorinated low index monomer (or polymer), may be used to fill grooves 824. As a result, the difference between the refractive index of the ridges and the refractive index of the grooves may be greater than 0.1, 0.2, 0.3, 0.5, 1.0, or higher.

The slanted grating may be fabricated using many different nanofabrication techniques. The nanofabrication techniques generally include a patterning process and a post-patterning (e.g., over-coating) process. The patterning process may be used to form slanted ridges of the slanted grating. There may be many different nanofabrication techniques for forming the slanted ridges. For example, in some implementations, the slanted grating may be fabricated using lithography techniques including slanted etching. In some implementations, the slanted grating may be fabricated using nanoimprint lithography (NIL) molding techniques. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any pattering technique.

Techniques and processes for fabricating the slanted grating described below are for illustration purposes only and are not intended to be limiting. A person skilled in the art would understand that various modifications may be made to the techniques described below. For example, in some implementations, some operations described below may be omitted. In some implementations, additional operations may be performed to fabricate the slanted grating. Techniques disclosed herein may also be used to fabricate other slanted structures on various materials.

Figure 9A:
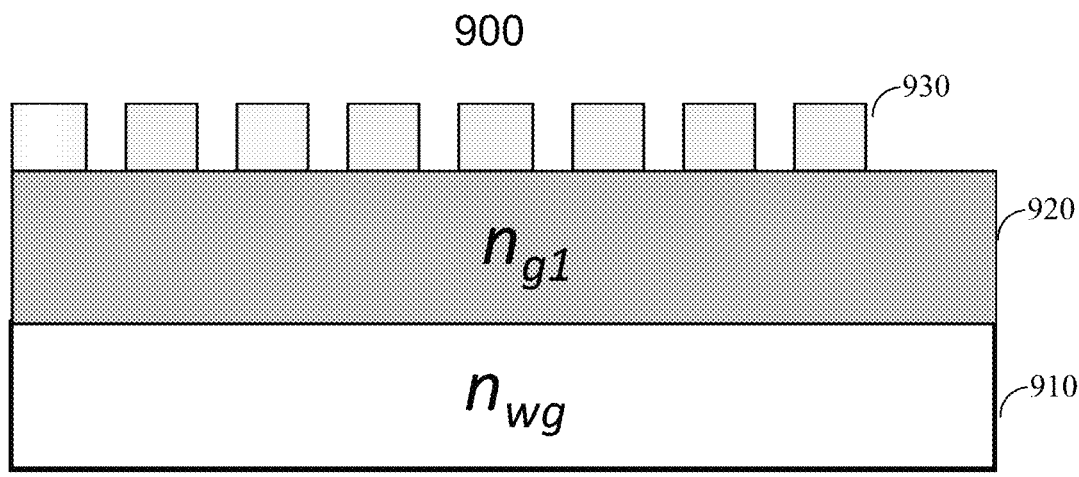
FIGS. 9A-9C illustrate an example process for fabricating a slanted surface-relief structure according to certain embodiments.
Figure 9B:
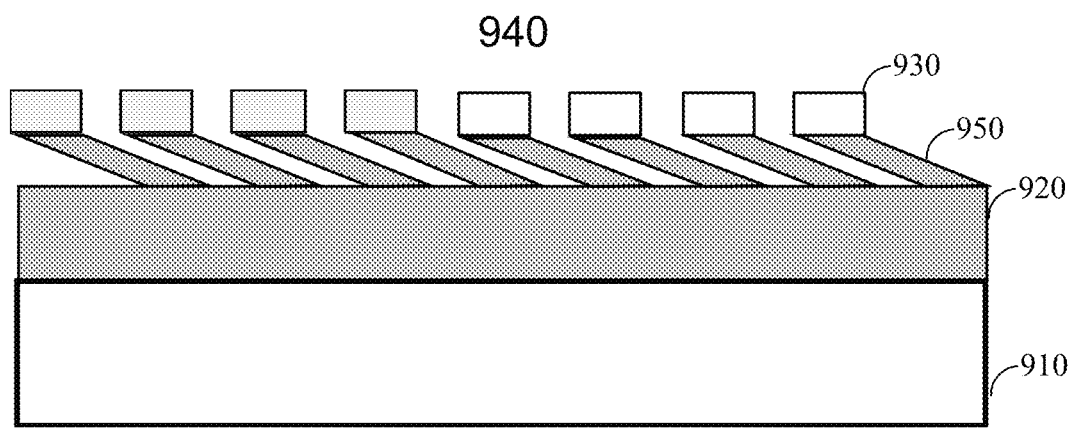
Figure 9C:
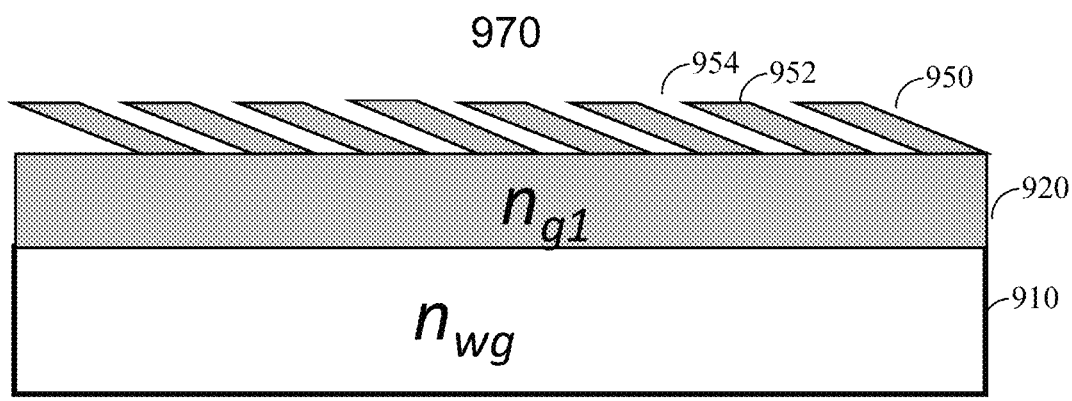

FIGS. 9A-9C illustrate an example simplified process for fabricating a slanted surface-relief grating by slanted etching according to certain embodiments. FIG. 9A shows a structure 900 after a lithography process, such as a photolithography process. In some embodiments, structure 900 may also be transferred from an intermediate layer using a lithography process. Structure 900 may include a substrate 910 that may be used as the waveguide of a waveguide display described above, such as a glass or quartz substrate. Structure 900 may also include a layer of grating material 920, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Substrate 910 may have a refractive index $n_{wg}$, and the layer of grating material 920 may have a refractive index $n_{g1}$. In some embodiments, layer of grating material 920 may be a part of substrate 910. A mask layer 930 with a desired pattern may be formed on the layer of grating material 920. Mask layer 930 may include, for example, a photoresist material, a metal (e.g., copper, chrome, aluminum, or molybdenum), an intermetallic compound (e.g., $MoSi_2$), or a polymer. Mask layer 930 may be formed by, for example, the lithography process.

FIG. 9B shows a structure 940 after a slanted etching process, such as a dry etching process (e.g., reactive ion etching (RIE), inductively coupled plasma (ICP), deep silicon etching (DSE), ion beam etching (IBE), or variations of IBE). The slanted etching process may include one or more sub-steps. The slanted etching may be performed by, for example, rotating structure 900 and etching the layer of grating material 920 by the etching beam based on the desired slant angle. In some embodiments, the slanted etching may be performed by spatially varying the incident angle of a narrow (e.g., point or line) etching beam, where the etching beam may be controlled spatially by blades that can tune the size and location of the projected etching beam. After the etching, a slanted grating 950 may be formed in the layer of grating material 920.

FIG. 9C shows a structure 970 after mask layer 930 is removed. Structure 970 may include substrate 910, the layer of grating material 920, and slanted grating 950. Slanted grating 950 may include a plurality of ridges 952 and grooves 954. Techniques such as plasma or wet etching may be used to strip mask layer 930 with appropriate chemistry. In some implementations, mask layer 930 may not be removed and may be used as part of the slanted grating.

Subsequently, in some implementations, the post-patterning (e.g., over-coating) process may be performed to over-coat slanted grating 950 with a material having a refractive index higher or lower than the material of ridges 952. For example, as described above, in some embodiments, a high refractive index material, such as Hafnia, Titania, Tungsten oxide, Zirconium oxide, Gallium sulfide, Gallium nitride, Gallium phosphide, silicon, and a high refractive index polymer, may be used for the over-coating. In some embodiments, a low refractive index material, such as silicon oxide, magnesium fluoride, porous silica, or fluorinated low index monomer (or polymer), may be used for the over-coating. As a result, the difference between the refractive index of the ridges and the refractive index of the grooves may be greater than 0.1, 0.2, 0.3, 0.5, 1.0, or higher. In some embodiments, the over-coating may be conformal (e.g., using ALD) or directional (e.g., using sputtering or PECVD).

In different applications, slanted structures (e.g., gratings) with various dimensions on various materials may be desired to control the behavior of light as the light reflects, refracts, and/or diffracts due to the interactions with the gratings and/or the interferences between light that interacts with the gratings. For example, in some applications, it may be desirable that the leading edge and the trailing edge of the ridges of the gratings are substantially parallel. In some applications, it may be desirable that the leading edge and the trailing edge of the ridges of the gratings have different slant angles. In some applications, it may be desirable that the grating has a depth greater than, for example, a few hundred nanometers, such as a few microns. In some applications, it may be desirable that the ridges of the grating have a slant angle greater than, for example, 30°, 45°, 50°, or 70°.

Figure 10:
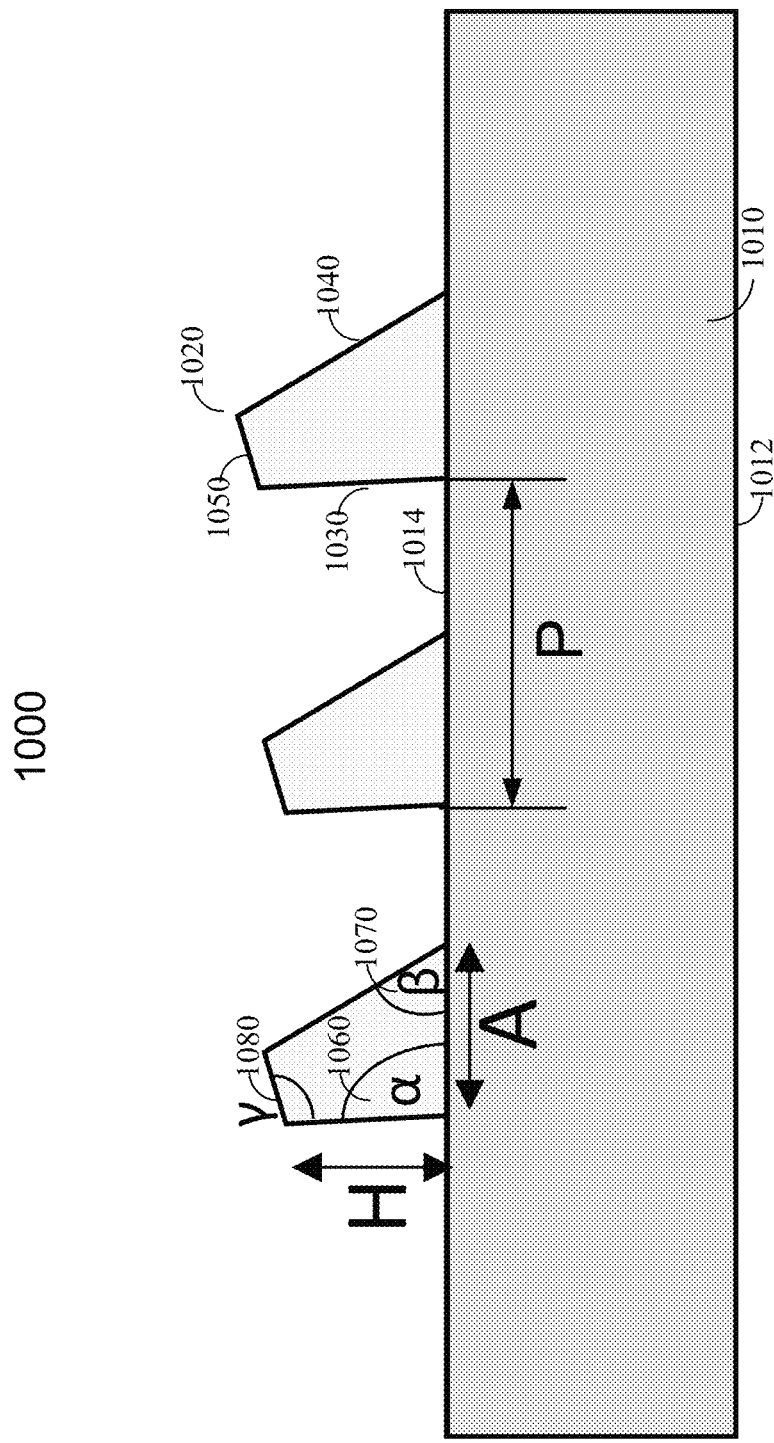
FIG. 10 illustrates an example slanted surface-relief structure according to certain embodiments.

FIG. 10 illustrates an example slanted grating 1000 on a substrate 1010. Grating 1000 may include a plurality of ridges 1020. The distance between the leading or trailing edges of adjacent ridges 1020 may be p, which may be a constant or varying value across grating 1000. Each ridge 1020 may have a height H, which may be a constant or varying value across grating 1000. Each ridge 1020 may have a regular or irregular cross-sectional shape, such as a quadrilateral. The quadrilateral may have a first (leading) edge 1030, a second (trailing) edge 1040, and a top edge 1050. The bottom of the quadrilateral may have a length A, which may be a constant or varying value across grating 1000. In some embodiments, first edge 1030 and second edge 1040 may be substantially parallel to each other. In some embodiments, top edge 1050 may be parallel to a bottom surface 1012 of substrate 1010. The region 1014 between two ridges 1020 may or may not have a flat surface. The internal angles of the quadrilateral formed by the edges may include a first angle $\alpha$ 1060, a second angle $\beta$ 1070, and a third angle $\gamma$ 1080. In some embodiments, the sum of first angle $\alpha$ 1060 and second angle $\beta$ 1070 may be close to 180°. In some embodiments, the sum of first angle $\alpha$ 1060 and third angle $\gamma$ 1080 may be close to 180°.

For many materials (e.g., silicon nitride, organic materials, or inorganic metal oxides) and/or certain desired slanted structures (e.g., grating ridges with substantially equal leading edge and trailing edge, slanted gratings with large slant angle, or deep slanted surface-relief grating) many known techniques, such as the IBE process, RIBE process, and CAIBE process, may not be used to reliably fabricate the slanted structures. According to certain embodiments, slanted ion implantation (e.g., $H^+$ ion implantation), chemical etch (e.g., diluted HF etch), and/or dry etch (e.g. reactive gas such as SF6) processes may be used to more accurately fabricate slanted structures with desired dimensions on various materials, including materials that may have a high refractive index.

Ion implantation is a low-temperature process for introducing ions of one or more elements into a target material. In ion implantation, dopant atoms may be volatilized, ionized, accelerated, separated by the mass-to-charge ratios, and directed at the target material, such as a silicon substrate. The dopant atoms may enter the target material, collide with the host atoms, lose energy, and come to rest at a certain depth within the target material. The average penetration depth may be determined by the dopant, the substrate material, and the acceleration energy. Ion implantation energies may range, for example, from about several hundred to about several million electron volts, resulting in ion distributions with average depths of, for example, from about <10 nm to about >10 µm. Each ion may include a single atom or molecule, and the total number (dose) of ions implanted in the target is the integration of the ion current over time. The dose and depth profile of ion implantation can be precisely controlled. Ion implantation may be performed in low temperature, and thus may use photoresist as mask. Other materials may also be used for the mask, such as oxide, poly-Si, metal, etc.

Ion implantation may change the physical, chemical, and/or electrical properties of the target material. For example, the ions penetrated into the target material can alter the elemental composition and/or electrical conductivity of the target material when the ions differ in composition from the target material. Ion implantation may cause chemical and/or physical changes in the target material when ions with a high energy or speed impinge on the target material. For example, the crystal structure of the target material may be changed or damaged by the energetic collision.

The ion implantation equipment generally includes an ion source for generating ions of the desired element, an accelerator for electrostatically accelerating the ions to a high speed (and thus a high energy), and a target chamber where the ions may impinge on a target mounted on a supporting structure. The supporting structure may move linearly, rotationally, or both, such that the implantation angle, area, dose, and time may be changed by controlling the movement of the supporting structure that holds the target.

Figure 11:
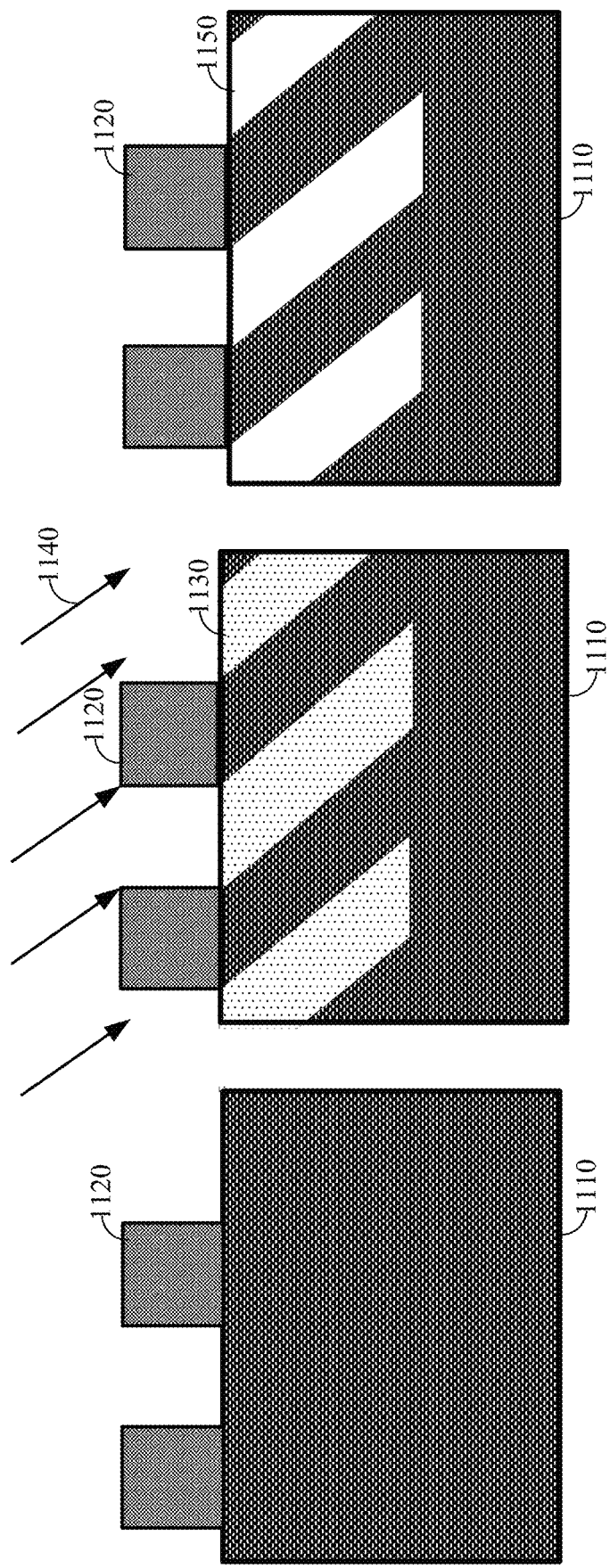
FIG. 11A illustrates an example substrate on which a slanted structure may be formed using a mask according to certain embodiments.
FIG. 11B illustrates an example slanted ion implantation process according to certain embodiments.
FIG. 11C illustrates an example slanted surface-relief structure formed on a substrate after ion implantation and etch processes according to certain embodiments.

FIG. 11A illustrates an example substrate 1110 on which slanted structures may be formed using a mask 1120 according to certain embodiments. Substrate 1110 may include one or more types of dielectric materials, such as glass, quartz, plastic, polymer, poly(methyl methacrylate) (PMMA), crystal, or ceramic. In some embodiments, the composition of the dielectric materials (e.g., layer stack-up) in substrate 1110 may be optimized to enable sufficient chemical and/or physical changes in substrate 1110. In some embodiments, substrate 1110 may include a semiconductor material, such as Si. In some embodiments, substrate 1110 may include a layer of material formed on a substrate, such as a $Si_3N_4$ or $SiO_2$ layer formed on a Si or other substrate. In some embodiments, substrate 1110 may include a silicon containing material (e.g., $SiO_2$, $Si_3N_4$, SiC, $SiO_xN_y$, or amorphous silicon), an organic material (e.g., spin on carbon (SOC) or amorphous carbon layer (ACL) or diamond like carbon (DLC)), or an inorganic metal oxide layer (e.g., $TiO_x$, $AlO_x$, $TaO_x$, $HfO_x$, etc.). Mask 1120 may include, for example, a photoresist material, a metal (e.g., copper, chrome, aluminum, or molybdenum), an intermetallic compound (e.g., $MoSi_2$), poly-silicon, or a polymer. The material used for mask 1120 and the thickness of mask 1120 may be selected based on the ions to be implanted. Mask 1120 may be thick enough such that ions may not penetrate through the mask and reach the substrate under the mask. In general, a mask with a lower thickness is desired in order to, for example, reduce scattering by the mask layer or not to block the ions from reaching the area to be implanted. A thinner mask may be used for lighter ions, such as $H^-$ ions. Mask 1120 may include a pattern corresponding to the desired cross-sectional shape of the slanted structure, and may be formed by, for example, a lithography process.

FIG. 11B illustrates an example slanted ion implantation process according to certain embodiments. As shown in FIG. 11B, an ion beam 1140 may impinge on substrate 1110 at a certain angle. In some embodiments, this may be achieved by rotating the substrate supporting structure to a desired angle. Mask 1120 on substrate 1110 may block a portion of the ions in ion beam 1140 such that the portion of the ions would not reach substrate 1110. In areas that are not blocked or are only partially blocked by mask 1120, the ions may enter substrate 1110, collide with the atoms in the substrate, lose energy, and finally rest at a certain depth within substrate 1110. After the ion implantation, a plurality of implanted regions 1130 may be formed. The depth of implanted regions 1130 may depend on the penetration depth, which may be determined by the ion element, the substrate material, and the energy of the ions. The total amount of ions implanted in each implanted region 1130 may depend on the ion current (flux) and the implantation time.

As described above, ion implantation may change the physical, chemical, or electrical properties of the target material. For example, a $Si_3N_4$ material layer may not be easily etched using, for example, diluted hydrofluoric acid (dHF), where the etch rate may be less than about 20 Å per minute at room temperature. When hydrogen ions are implanted into a $Si_3N_4$ material layer, the $Si_3N_4$ material layer may be modified according to:

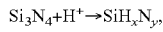

$$Si_3N_4 + H^+ \rightarrow SiH_xN_y,$$

where $SiH_xN_y$ may be relatively easily etched by dHF compared with $Si_3N_4$. Thus, hydrogen ion implantation may change the etch rate of the $Si_3N_4$ material layer. The implanted regions may have a much higher etch rate using dHF than the regions without hydrogen ion implantation. Therefore, anisotropic etching of the $Si_3N_4$ material layer may be achieved after selective ion implantation. In some embodiments, $O_2$ may be added to a $Si_3N_4$ film to form a $Si_xO_yN_z$ material.

FIG. 11C illustrates an example slanted surface-relief structure 1150 formed on substrate 1110 after one or more ion implantation and wet etching processes according to certain embodiments. As shown in FIG. 11C, implanted regions 1130 shown in FIG. 11B may be etched away to form slanted grooves within substrate 1110. In some embodiments, annealing may be performed after the ion implantation to promote the reaction, and hence the index modification and/or etch rate adjustment.

In some embodiments, the above described ion implantation process and wet etching process (e.g., using dHF or other etching solutions) may be performed repeatedly to form deep slanted structures in the substrate layer (e.g., $Si_3N_4$ material layer). The depth of the slanted structures may depend on the penetration depth of each ion implantation process. In this way, slanted structures with a high aspect ratio may be fabricated on a substrate. In some embodiments, the deep slanted structures can be achieved through simultaneous or sequential ion bombardment-based modification and modified layer removal with appropriate selection of feed gas mixture, ion source, and extraction parameters. The depth of the structures can be controlled by the etch time.

After slanted surface-relief structure 1150 is formed in substrate 1110, mask 1120 may be removed. In some embodiments, as described above, an overcoat layer may be formed on slanted surface-relief structure 1150 to fill the slanted grooves with a material having a refractive index different from the refractive index of substrate 1110.

In some embodiments, the ion implantation process described above with respect to FIG. 11B may be used to change the optical property of the target material, such as the refractive index of the target material. For example, a $Si_3N_4$ target layer may have a refractive index between 1.8 and 2.1 (e.g., 1.98). Ion implantation in the $Si_3N_4$ target layer (e.g., using oxygen ions) may change the implanted regions of the $Si_3N_4$ target layer into a second material (e.g., a silicon dioxide like material). The second material may have a refractive index different from the target material. In some embodiments, the refractive index of the second material may be lower than the refractive index of the target material. For example, the refractive index of the second material (e.g., $SiO_2$ like material) may be between 1.3 and 1.6, such as 1.46. Thus, a relatively high refractive index variation may be created within the target to form a Bragg-like grating. In some embodiments, depending on the ions used for the implantation, the refractive index of the second material may be higher than the refractive index of the target material.

In some applications, it may be desirable that the slanted structures are not uniform across the substrate. For example, some grating structures may work for light in a certain wavelength range and/or within a certain field of view. For light of different wavelength and/or within a different field of view, different grating structures may be needed. Thus, in some implementations, the slanted structures may include different structures at different areas in order to more effectively interact with (e.g., diffract) light in a wide wavelength range and within a large field of view. For example, the slanted structures may have different periods, different slant angles, different depths, different refractive index variations, or any combination thereof, in different areas on the substrate. Techniques described above may be used to make such slanted structures as described in detail below.

Figure 12:
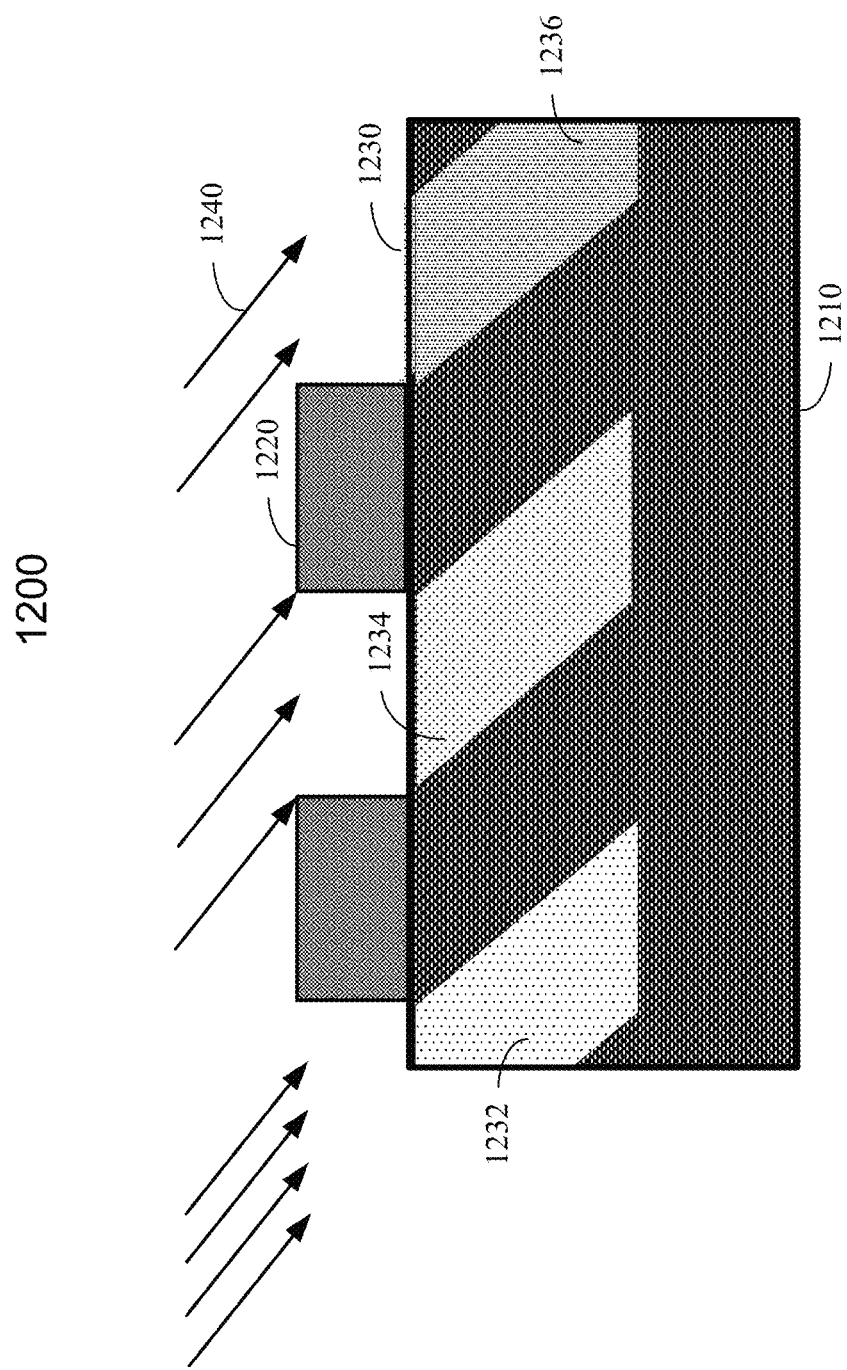
FIG. 12 illustrates an example process for fabricating slanted structures with different refractive indexes on a substrate according to certain embodiments.

FIG. 12 illustrates an example process for fabricating a slanted structure 1230 with a variable refractive index on a substrate 1210 according to certain embodiments. As described above, the refractive index of the substrate may be changed by ion implantation. The amount of refractive index change may depend on the ions used and the dose of the ion implantation. By selectively applying an ion implantation (e.g., changing the dose of the ions) at different regions of substrate 1210 (e.g., a $Si_3N_4$ substrate) using an ion beam 1240 and a mask 1220 (and/or a shutter), slanted structure 1230 having the variable refractive index may be formed on substrate 1210. The dose of the ions implanted into a region of substrate 1210 may be controlled by controlling the ion current and/or the implantation time. In some implementations, the implantation time may be controlled by a shutter or may be controlled by controlling the moving speed of the substrate supporting structure that holds the substrate. For example, as shown in FIG. 12, the dose of the ions (e.g., oxygen ions) implanted into region 1232 may be higher than the dose of the ions implanted into region 1234, and thus region 1232 may have a lower refractive index than region 1234. Similarly, the dose of the ions implanted into region 1234 may be higher than the dose of the ions implanted into region 1236, and thus region 1234 may have a lower refractive index than region 1236. Thus, slanted structure 1230 may have different refractive indexes and thus different diffractive performances (e.g., diffractive efficiencies) at regions 1232, 1234, and 1236.

Figure 13:
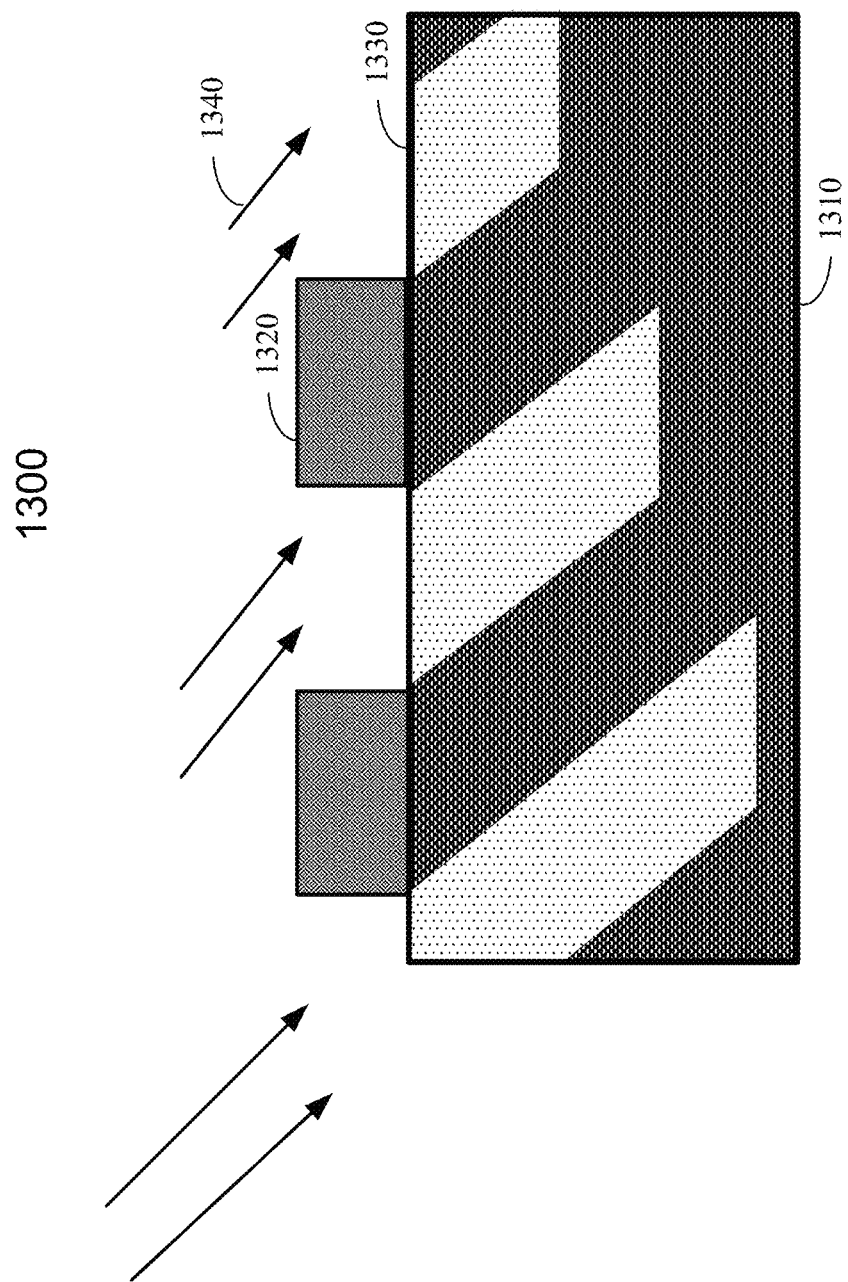
FIG. 13 illustrates an example process for fabricating slanted structures with different depths on a substrate according to certain embodiments.

FIG. 13 illustrates an example process for fabricating a slanted structure 1330 with a variable depth on a substrate 1310 according to certain embodiments. As described above, the depth of slanted structure 1330 may depend on the ion penetration depth, which may in turn depend on the ion element, the substrate material, and the energy of the ions. Thus, by varying the energy of the ions in an ion beam 1340 applied to different regions of substrate 1310 using a mask 1320, slanted structure 1330 having different depths at different regions may be formed in substrate 1310. In some implementations, the ion energy may be changed by changing the acceleration voltage of the accelerator in the ion implantation equipment.

Figure 14:
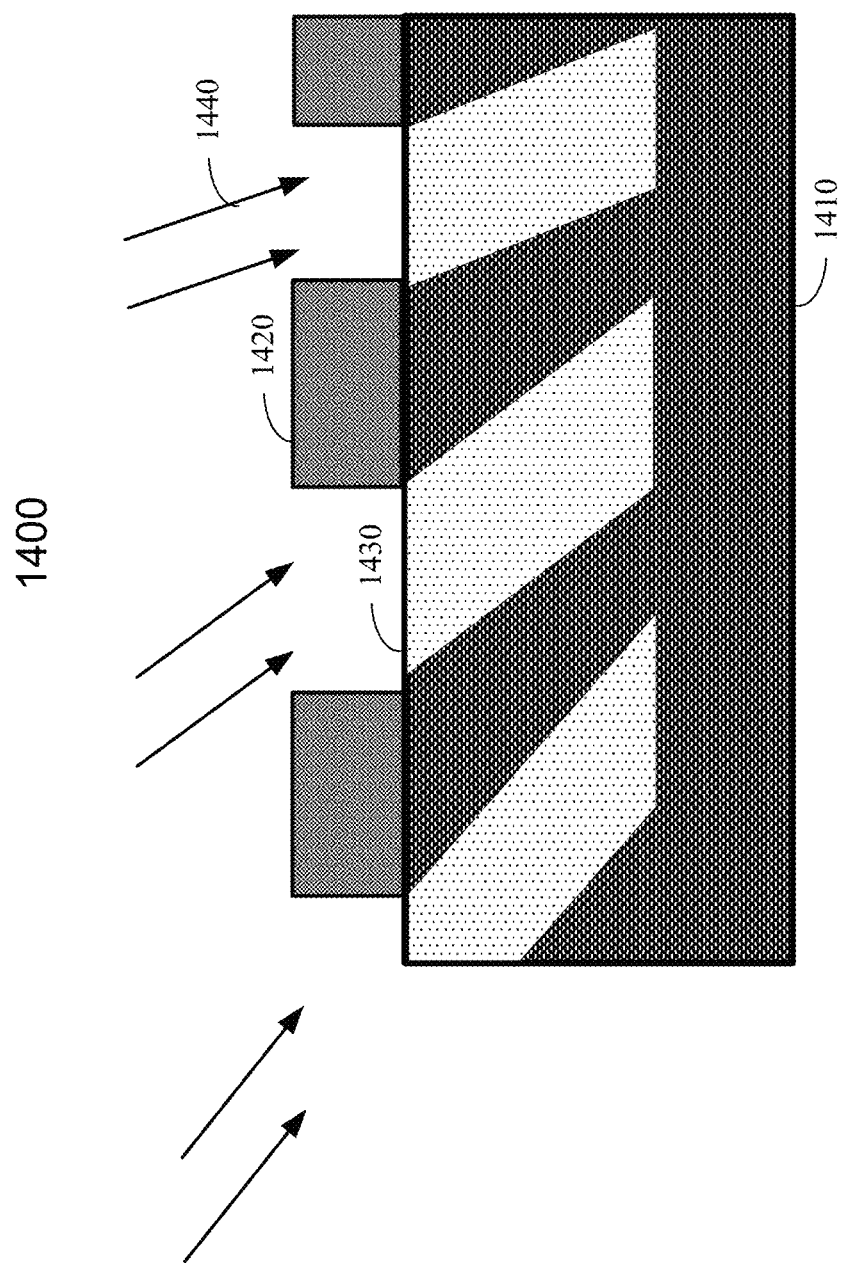
FIG. 14 illustrates an example process for fabricating slanted structures with different slant angles on a substrate according to certain embodiments.

FIG. 14 illustrates an example process for fabricating a slanted structure 1430 with a variable slant angle on a substrate 1410 according to certain embodiments. The slant angle of slanted structure 1430 may be changed by changing the angle of an ion beam 1440 with respect to the surface normal of substrate 1410. In some implementations, the angle of ion beam 1440 with respect to the surface normal of substrate 1410 may be changed by changing a rotation angle of a substrate supporting structure in the ion implantation equipment.

The techniques described above with respect to FIGS. 12-14 may be used individually or in any combination to fabricate slanted structures with a varying slant angle, depth, and/or refractive index in a substrate. For example, in some embodiments, different regions of the substrate may be implanted at different angles with ions having different energies to form implanted regions with different slant angles and depths. Due to the etch rate difference between the substrate and implanted regions, a slanted surface-relief structure with a varying slant angle and depth may be formed in the substrate. When an overcoat layer is formed on the slanted surface-relief structures, the over-coated material filled in the gaps in the surface-relief structure may have a varying slant angle and depth across the substrate. In some implementations, the above described techniques may also be used to modify the refractive index of at least some regions of the overcoat layer. In some implementations, the above described techniques may also be applied to the overcoat layer to form a structure with a varying slant angle, depth, or refractive index in the overcoat layer.

Figure 15:
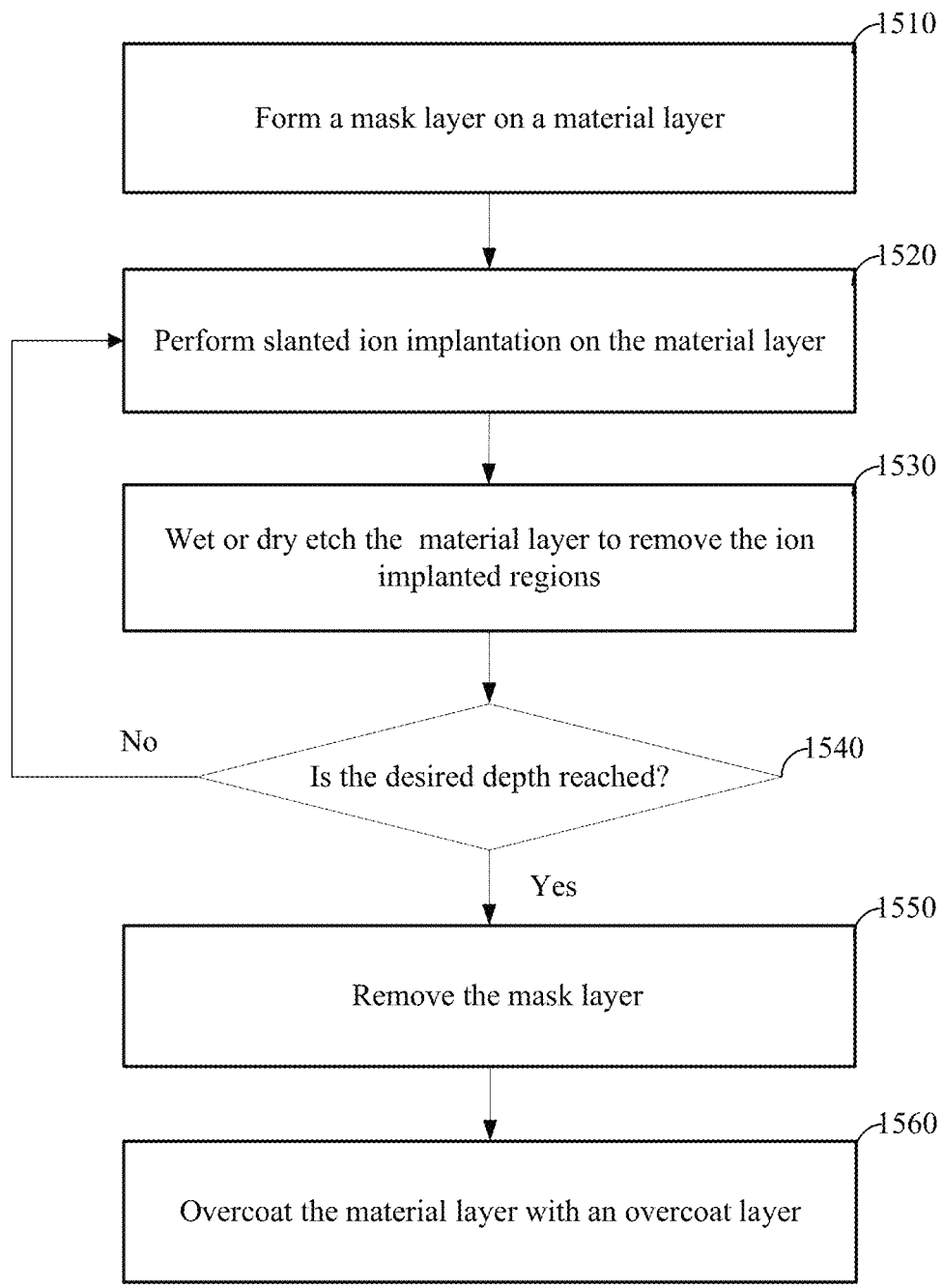
FIG. 15 is a simplified flow chart illustrating an example method of fabricating a slanted surface-relief structure according to certain embodiments.

FIG. 15 is a simplified flow chart 1500 illustrating an example method of fabricating a slanted structure according to certain embodiments. The operations described in flow chart 1500 are for illustration purposes only and are not intended to be limiting. In various implementations, modifications may be made to flow chart 1500 to add additional operations or to omit some operations. The operations described in flow chart 1500 may be performed using, for example, ion implantation equipment and/or wet etching equipment.

At block 1510, a mask layer may be formed on a material layer. The material layer may include one or more types of dielectric materials, such as glass, quartz, plastic, polymer, PMMA, crystal, or ceramic. In some embodiments, the material layer may include a semiconductor material, such as Si. In some embodiments, the material layer may include a silicon containing material (e.g., $SiO_2$, $Si_3N_4$, SiC, $SiO_xN_y$, or amorphous silicon), an organic material (e.g., spin on carbon (SOC) or amorphous carbon layer (ACL) or diamond like carbon (DLC)), or an inorganic metal oxide layer (e.g., $TiO_x$, $AlO_x$, $TaO_x$, $HfO_x$, etc.). The mask layer may include, for example, a photoresist material, a metal (e.g., copper, chrome, aluminum, or molybdenum), an intermetallic compound (e.g., $MoSi_2$), poly-silicon, or a polymer. The material used for the mask layer and the thickness of the mask layer may be selected based on the ions to be implanted. For example, a thinner mask layer may be used for lighter ions, such as $H^+$ ions. The mask layer may be thick enough such that ions may not penetrate through the mask and reach the material layer under the mask. The mask layer may include a pattern corresponding to the desired cross-sectional shape of the slanted structure, and may be formed by, for example, a lithography process.

At block 1520, the material layer may be implanted with an ion beam at a slant angle using the mask layer. The slant angle may be measured with respect to a surface normal of the material layer. In some embodiments, the slant angle may be greater than 30°, 45°, 50°, 70°, or larger. In some implementations, the slant angle may be controlled by rotating the material layer with respect to the ion beam using, for example, a rotatable supporting structure that can hold the material layer. The mask layer on the material layer may block a portion of the ions in the ion beam such that the portion of the ions would not reach the material layer. In areas that are not blocked or only partially blocked by the mask layer, the ions may enter the material layer, collide with the atoms in the material layer, and rest at some depth within the material layer. After the ion implantation, a plurality of implanted regions may be formed in the material layer. The depth of the implanted regions may depend on the penetration depth, which may depend on the ion element, the substrate material, and the energy of the ions. The total amount of ions implanted in each implanted region may depend on the ion current (flux) and the implantation time. In some embodiments, the ions in the ion beam may include hydrogen ions or oxygen ions. In some embodiments, during the implanting, the material layer may be rotated to vary the slant angle for the plurality of implanted regions across the slanted structure. In some embodiments, during the implanting, the ion energy of the ions in the ion beam may be adjusted to change the depth of the plurality of implanted regions across the slanted structure. In some embodiments, during the implanting, different amounts of ions may be implanted into different regions of the plurality of implanted regions by using different ion currents for the ion beam, different implantation time, or both. Implanting ions into the material layer may change the refractive index, etch rate, or both of the implanted regions. For example, implanting oxygen ions into a $Si_3N_4$ material layer may form a $SiO_2$ like material in the implanted regions, which may reduce the refractive index of the implanted region. Thus, a slanted Bragg-like grating may be formed after the implantation due to the refractive index changes caused by the ion implantation.

Optionally, at block 1530, the material layer may be wet-etched or dry etched to remove materials in the implanted regions to form a slanted surface-relief structure. As described above, implanting ions into the material layer may change the etch rate of the implanted regions. For example, implanting hydrogen ions into a $Si_3N_4$ material layer may significantly increase the etch rate of the implanted regions using diluted HF relative to the etch rate of the regions of the material layer that are not implanted with hydrogen ions. Thus, wet etching the selectively implanted material layer using diluted HF can be highly anisotropic, and may remove materials in the implanted regions while keeping the materials in the regions that are nor ion-implanted. Thus, a slanted surface-relief structure may be formed. The slant angle of the slanted surface-relief structure may correspond to the slant angle of the ion implantation, and the depth of the slanted surface-relief structure may depend on the ion energy of the ions in the ion beam as described above.

Optionally, at block 1540, if the desired depth of the slanted surface-relief structure is reached, the process may proceed to operations at block 1550. If the desired depth of the slanted surface-relief structure has not been reached, the process may proceed to operations at block 1520. For example, in some embodiments, it may be desirable that the depth of the slanted surface-relief structure is greater than 200 nm, 500 nm, 1 um, or 2 um. Thus, a single ion implantation process and a single wet etching process may not be able to achieve the desired depth due to, for example, the limitation of the achievable ion energy of the ions for the implantation and/or the limitation of the thickness of the mask layer that can block ions with a high ion energy. Therefore, in some implementations, multiple cycles of the operations at blocks 1520 and 1530 may be performed to etch a portion of the material layer in each cycle, such that the desired depth may be achieved after the multiple cycles of ion implantation and wet etching.

Optionally, at block 1550, the mask layer may be removed. As described above, techniques such as plasma or wet etching may be used to strip the mask layer with appropriate chemistry.

Optionally, at block 1560, the material layer with the slanted structure may be coated with a material having a refractive index different from the refractive index of the material layer. For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to coat the slanted grating and/or fill the gaps in the slanted surface-relief structure. In some embodiments, a low refractive index material, such as silicon oxide, magnesium fluoride, porous silica, or fluorinated low index monomer (or polymer), may be used to coat the slanted structure and/or fill the gaps in the slanted surface-relief structure. As a result, a slanted grating with a refractive index variation of greater than 0.1, 0.2, 0.3, 0.5, 1.0, or higher may be formed.

Embodiments of the invention may include or be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method of fabricating a slanted surface-relief grating in a material layer, the method comprising:
    forming a mask layer on the material layer;
    implanting ions into a plurality of regions of the material layer at a slant angle greater than zero using an ion beam and the mask layer, wherein the slant angle is measured with respect to a surface normal of the material layer, and wherein implanting the ions into the plurality of regions of the material layer changes an etch rate of the plurality of regions of the material layer; and
    etching, subsequent to implanting the ions into the plurality of regions, the material layer to selectively remove materials in the implanted plurality of regions of the material layer to form the slanted surface-relief grating in the material layer, wherein a difference between a first slant angle of a leading edge of a grating ridge of the slanted surface-relief grating with respect to the material layer and a second slant angle of a trailing edge of the grating ridge with respect to the material layer is less than 20% of the first slant angle.

2. The method of claim 1, wherein the material layer comprises one or more of a transparent substrate, a semiconductor substrate, a $SiO_2$ layer, a $Si_3N_4$ material layer, a titanium oxide layer, an alumina layer, a SiC layer, a $SiO_xN_y$ layer, an amorphous silicon layer, a spin on carbon (SOC) layer, an amorphous carbon layer (ACL), a diamond like carbon (DLC) layer, a $TiO_x$ layer, an $AlO_x$ layer, a $TaO_x$ layer, and an $HFO_x$ layer.

3. The method of claim 1, wherein the ions comprise hydrogen ions or oxygen ions.

4. The method of claim 1, wherein etching the material layer comprises wet-etching the material layer using an etchant to selectively remove materials in the implanted plurality of regions of the material layer.

5. The method of claim 4, wherein:
the material layer comprises a $Si_3N_4$ material layer;
the ions comprise hydrogen ions; and
the etchant comprises a diluted hydrofluoric acid.

6. The method of claim 4, further comprising:
performing the implanting and wet-etching repeatedly until a predetermined depth of the slanted surface-relief grating is reached.

7. The method of claim 6, wherein:
the predetermined depth of the slanted surface-relief grating is greater than 100 nm.

8. The method of claim 1, wherein implanting ions into the plurality of regions of the material layer at the slant angle greater than zero comprises at least one of:
rotating the material layer during the implanting to vary the slant angle for different regions of the plurality of regions; or
changing an ion energy of the ions during the implanting to change an implantation depth for the plurality of regions.

9. The method of claim 8, further comprising:
wet-etching the material layer using an etchant to remove materials in the plurality of regions of the material layer;
removing the mask layer; and
forming an overcoat layer on the material layer.

10. The method of claim 9, further comprising:
performing ion implantation on the overcoat layer to change refractive indexes in one or more regions of the overcoat layer.

11. The method of claim 10, wherein the overcoat layer includes one or more of fluorinated $SiO_2$, porous silicate, $SiO_xN_y$, $HFO_2$, and $Al_2O_3$.

12. The method of claim 1, further comprising:
etching the material layer using a reactive gas while implanting ions into the plurality of regions of the material layer using the ion beam.

13. The method of claim 1, wherein implanting ions into the plurality of regions of the material layer comprises:
implanting different amounts of ions into different regions of the plurality of regions by using different ion currents for the ion beam, different implantation times, or both when implanting different regions of the plurality of regions.

14. The method of claim 1, wherein:
the material layer comprises a $Si_3N_4$ material layer; and
the ions comprise oxygen ions.

15. The method of claim 1, wherein:
the slant angle is greater than 45°.

16. The method of claim 1, wherein implanting ions into the plurality of regions of the material layer at the slant angle comprises implanting ions into each respective region of the plurality of regions of the material layer at a single respective slant angle with respect to the material layer.

17. The method of claim 1, further comprising annealing, subsequent to implanting the ions into the plurality of regions and before etching the material layer, the material layer.

* * * * *